United States Patent
Konishi et al.

(10) Patent No.: US 11,031,238 B2
(45) Date of Patent: Jun. 8, 2021

(54) SILICON CARBIDE STACKED SUBSTRATE AND MANUFACTURING METHOD THEREOF

(71) Applicant: Hitachi Metals, Ltd., Tokyo (JP)

(72) Inventors: Kumiko Konishi, Tokyo (JP); Kiyoshi Oouchi, Tokyo (JP); Keisuke Kobayashi, Tokyo (JP); Akio Shima, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 16/484,306

(22) PCT Filed: Jan. 30, 2018

(86) PCT No.: PCT/JP2018/002857
§ 371 (c)(1),
(2) Date: Aug. 7, 2019

(87) PCT Pub. No.: WO2018/150861
PCT Pub. Date: Aug. 23, 2018

(65) Prior Publication Data
US 2020/0006066 A1 Jan. 2, 2020

(30) Foreign Application Priority Data
Feb. 20, 2017 (JP) .............................. JP2017-029210

(51) Int. Cl.
*H01L 21/02* (2006.01)
*H01L 21/20* (2006.01)
*H01L 21/205* (2006.01)

(52) U.S. Cl.
CPC .. *H01L 21/02378* (2013.01); *H01L 21/02658* (2013.01); *H01L 21/205* (2013.01); *H01L 21/2022* (2013.01)

(58) Field of Classification Search
CPC ......... H01L 21/02378; H01L 21/02658; H01L 21/2022; H01L 21/205
(Continued)

(56) References Cited

U.S. PATENT DOCUMENTS

2003/0045045 A1* 3/2003 Singh .................... H01L 29/868
438/200
2005/0064723 A1 3/2005 Sumakeris
(Continued)

FOREIGN PATENT DOCUMENTS

JP 2007506289 A 3/2007
JP 2009088223 A 4/2009
(Continued)

OTHER PUBLICATIONS

English Machine Translation of JP 2017/019679 (Year: 2017).*

*Primary Examiner* — Dzung Tran
(74) *Attorney, Agent, or Firm* — Miles & Stockbridge, P.C.

(57) ABSTRACT

In a silicon carbide stacked substrate, the efficiency of converting the basal plane dislocation (BPD) which is a fault to deteriorate the current-carrying reliability into a threading edge dislocation (TED) which is a harmless fault is improved, thereby improving the reliability of the silicon carbide stacked substrate. As means therefor, in a silicon carbide stacked substrate including a SiC substrate and a buffer layer and a drift layer which are epitaxial layers sequentially formed on the SiC substrate, a semiconductor layer having an impurity concentration lower than those of the SiC substrate and the buffer layer and higher than that of the drift layer is formed between the SiC substrate and the buffer layer so as to be in contact with an upper surface of the SiC substrate.

13 Claims, 11 Drawing Sheets

(58) Field of Classification Search
USPC .......................................................... 257/77
See application file for complete search history.

(56) References Cited

U.S. PATENT DOCUMENTS

| | | | |
|---|---|---|---|
| 2006/0289873 A1* | 12/2006 | Rowland | ........... H01L 21/02529 |
| | | | 257/77 |
| 2007/0015308 A1* | 1/2007 | Shenoy | ............... H01L 29/0615 |
| | | | 438/92 |
| 2009/0085044 A1 | 4/2009 | Ohno et al. | |
| 2009/0133753 A1* | 5/2009 | Sasaki | ................... H01L 31/075 |
| | | | 136/261 |
| 2009/0302328 A1 | 12/2009 | Ohno et al. | |

FOREIGN PATENT DOCUMENTS

| | | |
|---|---|---|
| JP | 2009295728 A | 12/2009 |
| JP | 2011114252 A | 6/2011 |
| JP | 2013107788 A | 6/2013 |
| JP | 2015002207 A | 1/2015 |
| JP | 2017019679 A | 1/2017 |
| JP | 2017019691 A | 1/2017 |
| WO | 2016092887 A1 | 6/2016 |

* cited by examiner

SILICON CARBIDE STACKED SUBSTRATE AND MANUFACTURING METHOD THEREOF

TECHNICAL FIELD

The present invention relates to a silicon carbide stacked substrate and a manufacturing method thereof.

BACKGROUND ART

Semiconductor power elements are required to have low on-resistance and low switching loss in addition to high withstand voltage, but silicon (Si) power elements which are current mainstream are approaching their theoretical performance limits. Since silicon carbide (SiC) has dielectric breakdown field strength higher by about one order of magnitude in comparison with Si, the element resistance can be theoretically reduced by three orders of magnitude or more by thinning a drift layer that holds the withstand voltage to about 1/10 and increasing an impurity concentration about 100 times. Also, since silicon carbide (SiC) has band gap larger by about three orders of magnitude in comparison with Si, SiC semiconductor elements can operate at higher temperature and are expected to have higher performance than Si semiconductor elements.

Patent Document 1 (Japanese Patent Application Laid-Open Publication No. 2007-506289) describes that, in order to reduce the density of dislocations (faults) in an epitaxial layer, portions where dislocations are present are removed by sequentially performing non-selective etching and selective etching on a surface of a SiC substrate, and then the epitaxial layer is formed.

Patent Document 2 (Japanese Patent Application Laid-Open Publication No. 2009-295728) describes that a semiconductor layer (buffer layer) having an impurity concentration lower than that of a SiC substrate and higher than that of an epitaxial layer (drift layer) is formed between the SiC substrate and the epitaxial layer (drift layer).

Patent Document 3 (International Publication No. 2016/092887) describes that, when a first epitaxial layer, a second epitaxial layer, and a third epitaxial layer are sequentially formed on a SiC substrate, a concentration of the second epitaxial layer is increased to $1 \times 10^{17}$ cm$^{-3}$ or higher and the second epitaxial layer is used as a hole trap.

RELATED ART DOCUMENTS

Patent Documents

Patent Document 1: Japanese Patent Application Laid-Open Publication No. 2007-506289
Patent Document 2: Japanese Patent Application Laid-Open Publication No. 2009-295728
Patent Document 3: International Publication No. 2016/092887

SUMMARY OF THE INVENTION

Problems to be Solved by the Invention

In the case where BPD (Basal Plane Dislocation) is formed in an epitaxial layer on a SiC substrate, stacking fault grows in the epitaxial layer when a current flows through the region in which the BPD is formed, so that a problem of increase of a resistance value of a silicon carbide stacked substrate arises.

A large majority of BPDs in the epitaxial layer is originated from the BPDs originally present in the substrate. Therefore, the BPD present in the epitaxial layer cannot be suppressed by devising the manufacturing method of the device, and it is essential to improve the quality of the substrate (reduction of BPD density) in order to suppress the occurrence of the BPD.

Also, it is known that some BPDs are converted into threading edge dislocations (TEDs) at the interface between the SiC substrate and the epitaxial layer. The TED has no expandability and is harmless to current-carrying reliability. Therefore, one of the methods for preventing the increase of resistance of the silicon carbide stacked substrate due to the growth of BPD is a method of improving the efficiency of converting BPD to TED.

However, in the technology described in the Patent Document 1, an epitaxial layer is formed on a substrate after a surface of the substrate is recessed in order to remove the BPD. Therefore, morphology of the surface of the epitaxial layer is greatly deteriorated and a problem of increase in leakage current arises in off-characteristics. Also, in the technology described in the Patent Document 2, since the difference between the impurity concentration of the buffer layer and the impurity concentration of the SiC substrate is small, there is a problem that the conversion efficiency from the BPD to the TED is not sufficiently improved. Further, in the technology described in the Patent Document 3, it is not possible to suppress the BPD penetrating from the inside of the second epitaxial layer to the upper surface side of the third epitaxial layer from expanding to the stacking fault, and it is necessary to reduce the BPD by increasing the conversion efficiency of the BPD into the TED. In addition, in the Patent Document 3, since the dormer concentration of the first epitaxial layer is excessively low, the resistance of the first epitaxial layer increases, and the problem of deterioration of the element characteristics arises.

The above and other objects and novel characteristics of the present invention will be apparent from the description of this specification and the accompanying drawings.

Means for Solving the Problems

The following is a brief description of an outline of the typical embodiment disclosed in this application.

A silicon carbide stacked substrate according to a typical embodiment comprises a first semiconductor layer of a first conductivity type, a second semiconductor layer of the first conductivity type, and a third semiconductor layer of the first conductivity type formed on a SiC substrate of the first conductivity type, and an impurity concentration of the first semiconductor layer is lower than that of the second semiconductor layer and is higher than that of the third semiconductor layer, and the impurity concentration of the second semiconductor layer is lower than that of the SiC substrate.

Effects of the Invention

According to the typical embodiment, it is possible to suppress the increase of the resistance in the silicon carbide stacked substrate, so that it is possible to improve the reliability of the silicon carbide stacked substrate.

BRIEF DESCRIPTIONS OF THE DRAWINGS

DETAILED DESCRIPTION OF PREFERRED EMBODIMENTS

Figure 1:
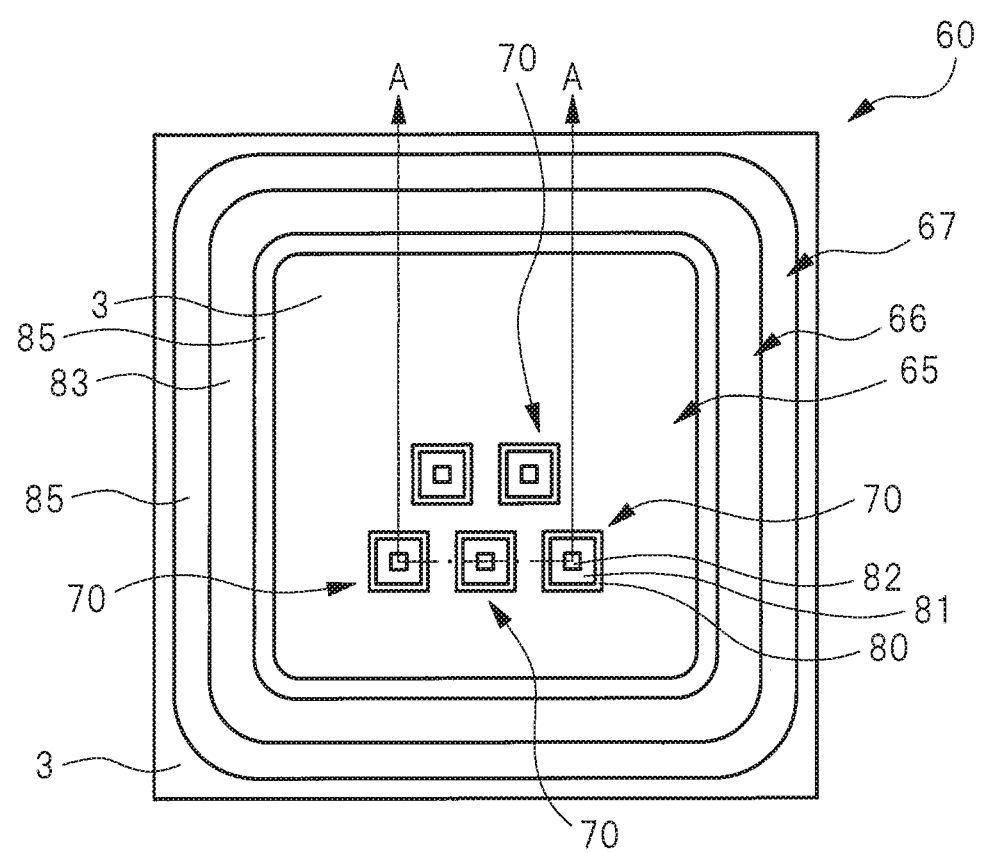
FIG. 1 is a plan view of a semiconductor chip using a silicon carbide stacked substrate according to a first embodiment of the present invention.

Hereinafter, embodiments of the present invention will be described in detail with reference to the drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

Also, the signs "−" and "+" represent the relative concentration of the impurity having n or p conductivity type. For example, in the case of an n type impurity, the impurity concentration becomes higher in the order of "n$^{--}$", "n$^{-}$", "n", "n$^{+}$", and "n$^{++}$".

The substrate mentioned in this application indicates a semiconductor substrate including no epitaxial layer or a substrate having a stacked structure including a semiconductor substrate and an epitaxial layer on the semiconductor substrate. When "SiC substrate", "semiconductor substrate", or "SiC semiconductor substrate" are simply mentioned in the following embodiments, these substrates mean the substrate including no epitaxial layer. On the other hand, when "silicon carbide stacked substrate" is simply mentioned in the following embodiments, the substrate means the stacked substrate including a semiconductor substrate and an epitaxial layer on the semiconductor substrate.

(First Embodiment)
<Configuration of Silicon Carbide Stacked Substrate>

Figure 2:
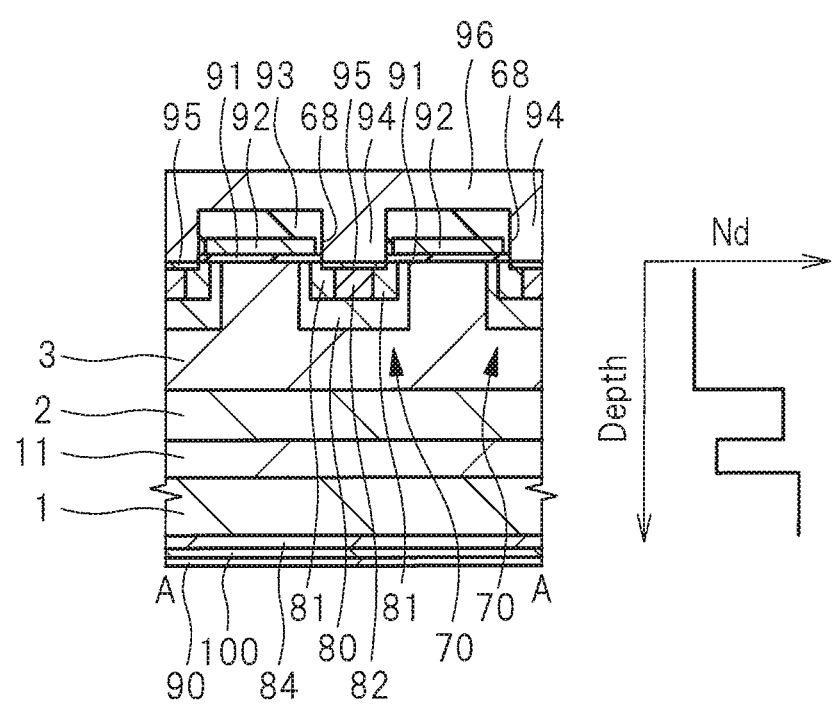
FIG. 2 is a cross-sectional view taken along a line A-A of FIG. 1.
Figure 3:
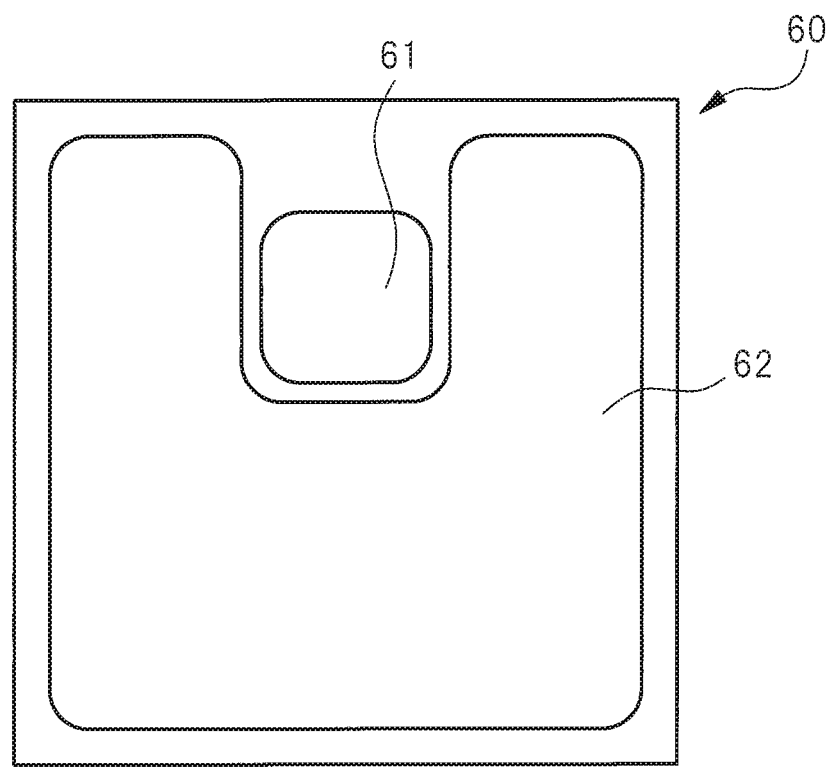
FIG. 3 is a plan view of the semiconductor chip using the silicon carbide stacked substrate according to the first embodiment of the present invention.

Hereinafter, a structure of a semiconductor chip using a silicon carbide stacked substrate according to the present embodiment will be described with reference to FIGS. 1 to 3. FIG. 1 is a plan view of the semiconductor chip using the silicon carbide stacked substrate according to the present embodiment. FIG. 2 is a cross-sectional view taken along a line A-A of FIG. 1. FIG. 3 is a plan view of the semiconductor chip using the silicon carbide stacked substrate according to the present embodiment, and FIG. 3 shows a pad forming layer in an upper layer than a region where a plurality of elements shown in FIG. 1 are formed.

As shown in FIG. 1, a semiconductor chip 60 includes a drift layer 3 which is an epitaxial layer formed on a front surface side of a semiconductor substrate. FIG. 1 mainly shows an upper surface of the drift layer 3, and illustrations of a gate insulating film, a gate electrode, an interlayer insulating film, a silicide layer, a contact plug, a passivation film, a pad, and others above the drift layer 3 are omitted. FIG. 1 shows the upper surface of the drift layer 3 and various semiconductor regions formed on the upper surface.

On the left side of FIG. 2, a cross-sectional view taken along a line A-A of FIG. 1 shows a structure of an element region at the center of the semiconductor chip 60 (see FIG. 1) including a SiC (silicon carbide) MOSFET (Metal Oxide Semiconductor Field Effect Transistor). Namely, the cross-sectional view on the left side of FIG. 2 shows a cross section of a plurality of SiC MOSFETs (hereinafter, referred to simply as "MOSFET" in some cases) in an active region of the semiconductor chip 60.

On the right side of FIG. 2, a relationship between a depth direction of the cross-sectional structure shown on the left side of FIG. 2 and an impurity concentration is shown with a graph. Namely, the horizontal axis of the graph represents the impurity concentration (here, concentration of n type impurity) and the vertical axis represents the depth. The depth mentioned here indicates a depth from an upper surface to a lower surface of a stacked structure made up of a SiC substrate (semiconductor substrate, semiconductor layer) 1, a semiconductor layer (basal plane dislocation conversion layer, epitaxial layer) 11, a buffer layer (depletion barrier layer, epitaxial layer, semiconductor layer) 2, and a drift layer (semiconductor layer, epitaxial layer) 3 constituting the semiconductor chip 60. Also, the depth indicates a distance from top to bottom in a direction perpendicular to a main surface of the SiC substrate 1. This graph shows only the impurity concentration of each of the SiC substrate 1, the semiconductor layer 11, the buffer layer 2, and the drift layer 3, and does not show the impurity concentrations of other portions where the contact region, the well region, the source region, the drain region, and others are formed.

The SiC substrate 1 is an n$^{++}$ type hexagonal semiconductor substrate, and the SiC substrate 1, the semiconductor layer 11, the buffer layer 2, and the drift layer 3 are all configured of n type semiconductor made of SiC (silicon carbide). The silicon carbide stacked substrate according to the present embodiment is configured of a stacked structure including the SiC substrate 1, the semiconductor layer 11, the buffer layer 2, and the drift layer 3 constituting the semiconductor chip 60. In other words, the conductivity type (first conductivity type) of the SiC substrate 1 and respective epitaxial layers (for example, the semiconductor layer 11, the buffer layer 2, and the drift layer 3) on the SiC substrate 1 is n type.

Note that the silicon carbide stacked substrate mentioned in this application does not indicate only the disk-like substrate before dicing, but indicates the substrate constituting the semiconductor chip obtained by performing the dicing process after forming elements in the epitaxial layer on the substrate.

As shown in FIG. 1, a plurality of MOSFETs each having a cell structure are mounted on the silicon carbide stacked substrate according to the present embodiment, and a singulated silicon carbide stacked substrate constitutes the semiconductor chip 60. FIG. 3 shows each pad used to supply potential to a gate electrode (not shown) and a source region 81 constituting these MOSFETs.

As shown in FIG. 3, a gate pad 61 to which a gate voltage is applied from an external control circuit (not shown) is formed on an upper surface of the semiconductor chip 60. The gate pad 61 is electrically connected to a gate electrode 92 (see FIG. 2) constituting the above-described MOSFET. Also, the source regions of the plurality of MOSFETs formed in the semiconductor chip 60 are electrically connected in parallel to each other, and are connected to a source pad 62. Namely, one source pad 62 is electrically connected to the plurality of source regions.

In an element region (active region) 65 at the center of the semiconductor chip 60 shown in FIG. 1, a plurality of unit cells 70 to be a minimum unit structure of the MOSFET are arranged. The gate voltage applied to the gate pad 61 shown in FIG. 3 is supplied to a gate electrode (not shown) of each unit cell 70 through the gate pad 61. Note that the position and the number of the gate pad 61 or the shape of the source pad 62 shown in FIG. 3 may be changed in various ways, but they do not affect the effect of the silicon carbide stacked substrate according to the present embodiment.

As shown in FIG. 1, the semiconductor chip 60 has a rectangular shape in plan view. In plan view, the element region 65 is present at the center of the semiconductor chip 60, and a peripheral region 66 and a termination region 67 are present so as to surround the element region 65. Namely, in plan view, the element region 65, the peripheral region 66, and the termination region 67 are sequentially present from the center of the upper surface of the drift layer 3 on the semiconductor substrate constituting the semiconductor chip 60 toward the end portion of the upper surface of the drift layer 3.

Note that the termination region 67 is a region including the peripheral region 66. The peripheral region 66 is a power feeding portion for supplying a potential to a JTE (Junction Termination Extension) region 85 formed in the termination region 67. Each of the peripheral region 66 and the termination region 67 has an annular structure extending along each side of the rectangular semiconductor chip 60. The JTE region 85 is a p type semiconductor region formed in the upper surface of the drift layer 3.

In the element region 65 surrounded by the peripheral region 66, the plurality of unit cells 70 each including a well region 80, the source region 81, and a first contact region 82 are arranged. The unit cell 70 is a minimum unit structure of the MOSFET. In the upper surface of the drift layer 3, the plurality of unit cells 70 are separated from each other. In plan view, the first contact region 82 is disposed at the center of each unit cell 70, and the source region 81 and the well region 80 are sequentially arranged around it.

Namely, in plan view, the source region 81 is formed so as to surround the outside of the first contact region 82, and the well region 80 is formed so as to surround the outside of the source region 81. In plan view, the first contact region 82, the source region 81, and the well region 80 all have a rectangular structure.

The first contact region 82 and the source region 81 are adjacent to each other, and a silicide layer 95 (see FIG. 2) is formed on the upper surfaces of the first contact region 82 and the source region 81 so as to cross over the boundary between the first contact region 82 and the source region 81.

In this case, the unit cell 70 is shown as having a square structure in plan view, but the unit cell 70 is not limited to this and may have a rectangular or polygonal shape. In addition, though only five unit cells 70 are shown in FIG. 1, a larger number of unit cells 70 are arranged in the element region 65 in practice.

Further, in this case, the plurality of unit cells 70 are arranged in rows in a first direction which is parallel to two parallel sides of the end portions of the semiconductor chip 60, and the plurality of rows are arranged in a direction orthogonal to the first direction. Further, the unit cells 70 in the rows adjacent in a second direction are alternately arranged so as to be shifted by half cycle in the first direction. However, the arrangement is not limited to this, and the plurality of unit cells 70 may be arranged with equal pitch in the vertical and lateral directions. Namely, the plurality of unit cells 70 may be arranged in matrix.

In the peripheral region 66, an annular second contact region 83 is formed in the upper surface of the drift layer 3. The peripheral region 66 mentioned here indicates the region overlapped with the second contact region 83 in plan view. Namely, the layout of the peripheral region 66 is defined by a forming region of the second contact region 83. The second contact region 83 is a p$^+$ type semiconductor region formed in the upper surface of the drift layer 3. The second contact region 83 is a region formed for fixing the potential of the termination region 67 and is a region for supplying potential to the JTE region 85.

By applying a potential to the JTE region 85 through the second contact region 83, the field concentration in the termination region at the time of applying a reverse voltage can be relaxed, and the high withstand voltage of the semiconductor chip can be maintained. In this case, the structure in which the JTE region is formed as the termination structure of the semiconductor chip will be described, but the termination structure for relaxing the electric field of the semiconductor chip may be a FLR (Field Limiting Ring) structure having a plurality of p type semiconductor regions annularly surrounding the element region in plan view.

As shown in FIG. 2, the semiconductor chip 60 (see FIG. 1) according to the present embodiment includes the SiC substrate 1 which is an n$^{++}$ type hexagonal semiconductor substrate. The n$^-$ type semiconductor layer 11 made of SiC having an impurity concentration lower than that of the SiC substrate 1 is formed on the SiC substrate 1. The n$^+$ type buffer layer 2 made of SiC having an impurity concentration higher than that of the semiconductor layer 11 and lower than that of the SiC substrate 1 is formed on the semiconductor layer 11. The n$^{--}$ type drift layer 3 made of SiC having an impurity concentration lower than that of the semiconductor layer 11 is formed on the buffer layer 2.

The SiC substrate 1, the semiconductor layer 11, the buffer layer 2, and the drift layer 3 contain an n type impurity (for example, nitrogen (N) or phosphorus (P)). The above-described impurity concentration of each of the SiC substrate 1, the semiconductor layer 11, the buffer layer 2, and the drift layer 3 means a concentration (Nd) of an n type impurity. In the element region, a plurality of n channel MOSFET cell structures are formed in the upper surface of the drift layer 3.

As shown in the graph on the right side of FIG. 2, the relationship of the impurity concentration is the SiC substrate 1>the buffer layer 2>the semiconductor layer 11>the drift layer 3. The main feature of the present embodiment is that the semiconductor layer (basal plane fault conversion layer) 11 having an impurity concentration lower than that of the SiC substrate 1 is formed on the SiC substrate 1 having a high concentration so as to be in contact with the main surface of the SiC substrate 1. Also, another feature of the present embodiment is that the impurity concentration of the semiconductor layer 11 is higher than that of the drift layer 3 having the elements formed in the upper surface thereof.

For example, the concentration of the n type impurity of the SiC substrate 1 is higher than $1\times10^{18}$ cm$^{-3}$ and $1\times10^{19}$ cm$^{-3}$ or lower. The main surface of the SiC substrate 1 is, for example, a Si surface and is a {0001} plane inclined by 4 to 8 degrees in a <11-20> direction. For example, a film thickness of the semiconductor layer 11 is several hundred nm. The n type impurity concentration of the semiconductor layer 11 is higher than $1\times10^{16}$ cm$^{-3}$ and $1\times10^{17}$ cm$^{-3}$ or lower. A film thickness of the buffer layer 2 is, for example, 0.5 to 8 μm. The n type impurity concentration of the buffer layer 2 is $1\times10^{17}$ cm$^{-3}$ or higher and lower than $1\times10^{19}$ cm$^{-3}$. A film thickness of the drift layer 3 is, for example, 3 to 80 μm. The n type impurity concentration of the drift layer 3 can be set arbitrarily depending on the specifications of the power device formed in the upper portion of the drift layer 3 and is, for example, $1\times10^{14}$ cm$^{-3}$ or higher and lower than $5\times10^{16}$ cm$^{-3}$.

Although there are the overlapping ranges in the numerical values of the respective impurity concentrations of the substrate and each semiconductor layer shown as an example, the relationship of the SiC substrate 1>the semiconductor layer 11>the drift layer 3 always holds in the impurity concentration in the silicon carbide stacked substrate according to the present embodiment. For example, when the impurity concentration of the drift layer 3 is $2\times10^{16}$ cm$^{-3}$, the impurity concentration of the semiconductor layer 11 is higher than $2\times10^{16}$ cm$^{-3}$ without fail.

Also, although the impurity concentration of the semiconductor layer 11 is always lower than the impurity concentrations of the SiC substrate 1 and the buffer layer 2, the impurity concentration of the buffer layer 2 may exceed the impurity concentration of the SiC substrate 1. However, if the impurity concentration of the SiC substrate 1 is higher than the impurity concentration of the buffer layer 2, the concentration difference between the semiconductor layer 11 and the SiC substrate 1 increases, so that the efficiency of the conversion of BPD into TED described later can be improved.

Also, on a rear surface side opposite to the main surface of the semiconductor chip 60 (see FIG. 1), a drain wiring electrode 90 of the MOSFET is formed. Specifically, on the rear surface of the SiC substrate 1, a drain region 84 which is an n type semiconductor region having an impurity concentration higher than that of the SiC substrate 1 is formed, and a third silicide layer 100 is formed so as to be in contact with a bottom surface of the drain region 84. Namely, the rear surface of the SiC substrate 1 is covered with the third silicide layer 100. A bottom surface of the third silicide layer 100, that is, the surface on an opposite side to the SiC substrate 1 is covered with the drain wiring electrode 90.

In the element region, the plurality of well regions 80 which are p type semiconductor regions are formed at a predetermined depth from the upper surface of the drift layer 3. The well region 80 is a semiconductor region into which a p type impurity (for example, aluminum (Al) or boron (B)) is introduced. In each well region 80, the source region 81 which is an n$^{+}$ type semiconductor region is formed at a predetermined depth from the upper surface of the drift layer 3. The source region 81 is a semiconductor region into which an n type impurity (for example, nitrogen (N) or phosphorus (P)) is introduced.

Also, in each well region 80, the first contact region 82 which is a p$^{+}$ type semiconductor region is formed at a predetermined depth from the upper surface of the drift layer 3. The first contact region 82 is a region provided to fix the potential of the well region, and has substantially the same depth as that of the source region 81. The first contact region 82 is a semiconductor region into which a p type impurity (for example, aluminum (Al) or boron (B)) is introduced. The first contact region 82 is disposed so as to be sandwiched by the adjacent source region 81 from both sides. Also, a bottom of the first contact region 82 and a bottom and a side surface of the source region 81 are covered with the well region 80.

In the upper surface of the drift layer 3, the plurality of unit cells 70 including the well region 80, the source region 81, and the first contact region 82 are formed, and the unit cells 70 are separated from each other. On the drift layer 3 between the adjacent unit cells 70, the gate electrode 92 is formed with a gate insulating film 91 interposed therebetween, and an upper surface of an end portion of the gate insulating film 91 and a side surface and an upper surface of the gate electrode 92 are covered with an interlayer insulating film 93. In an opening 68 between the interlayer insulating films 93 each covering the gate electrode 92, the first contact region 82 and the source region 81 are not covered with the gate insulating film 91, the gate electrode 92, and the interlayer insulating film 93. Namely, the gate insulating film 91, the gate electrode 92, and the interlayer insulating film 93 have the opening 68 which reaches the upper surface of the unit cell 70, and the first contact region 82 and the source region 81 are exposed at the bottom of the opening 68.

On each surface of a part of the source region 81 and the first contact region 82 exposed at the bottom of the opening 68 of the interlayer insulating film 93, that is, the contact hole in the element region, the silicide layer 95 is formed. In the opening 68 on the silicide layer 95 in contact with a part of the source region 81 and the first contact region 82, a contact plug 94 which is a connection portion is buried. Each of the plurality of contact plugs 94 buried in the plurality of openings 68 is integrated with a source wiring electrode 96 formed on the interlayer insulating film 93. The source wiring electrode 96 is electrically connected to the source pad 62 (see FIG. 3). In this case, an upper surface of the source wiring electrode 96 exposed from the passivation film (not shown) covering an upper portion of the termination region constitutes the source pad 62.

A part of the source region 81 and the first contact region 82 are electrically connected to the contact plug 94 so as to have ohmic properties through the silicide layer 95. Therefore, a part of the source region 81 and the first contact region 82 are connected to the source pad 62 through the silicide layer 95, the contact plug 94, and the source wiring electrode 96. Similarly, a contact plug is connected to the gate electrode 92 in a region (not shown), and the gate electrode 92 is electrically connected to the gate pad 61 (see FIG. 3) through the contact plug and a gate wiring electrode.

The MOSFET formed in the semiconductor chip according to the present embodiment includes at least the gate electrode 92, the source region 81, and the drain region 84. When the MOSFET is to be operated, a predetermined voltage is applied to the gate electrode 92 to turn on the MOSFET, thereby passing a current from the drain having a high potential to a source having a low potential. The channel region of the MOSFET is formed in an upper portion of the well region 80 which is a p type semiconductor region. Namely, the current at the time of driving the MOSFET flows from the drain wiring electrode 90, passes through the region in the drift layer 3 and near the gate insulating film 91, passes through the region in the well region 80 near the upper surface of the drift layer 3 and immediately below the gate electrode 92, and then reaches the source region 81.

In the present embodiment, when supplying a potential to the first contact region 82, a pn current flows through a pn junction of a built-in diode (built-in pn diode) of the MOSFET. Also, when supplying a potential to the second contact region 83, a pn current flows through a pn junction of a built-in diode of the termination region. The built-in diode of the MOSFET mentioned here indicates, for example, a pn junction portion between the p type well region 80 connected to the $p^+$ type first contact region 82 and the $n^{--}$ type drift layer 3. Further, the built-in diode of the termination region mentioned here indicates, for example, a pn junction portion between the p type JTE region 85 (see FIG. 1) connected to the $p^+$ type second contact region 83 (see FIG. 1) and the $n^{--}$ type drift layer 3. Note that the current flowing through the pn junction in the substrate including the drift layer 3 is referred to as a pn current in this application.

<Manufacturing Method of Silicon Carbide Stacked Substrate>

A manufacturing method of a silicon carbide stacked substrate and a semiconductor device including the substrate according to the present embodiment will be described in order of steps with reference to FIGS. 4 to 13. FIGS. 4 to 13 are cross-sectional views showing a manufacturing process of the semiconductor chip using the silicon carbide stacked substrate according to the present embodiment. FIGS. 4 to 13 show the cross section of the element region in which the MOSFET is formed. The cross section of the element region in each of FIGS. 4 to 13 is the cross section at the same position as that described with reference to FIG. 2.

Figure 4:
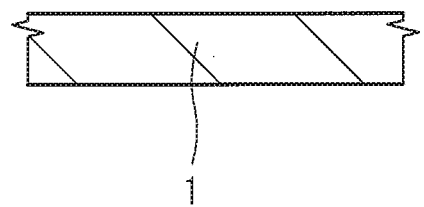
FIG. 4 is a cross-sectional view showing a manufacturing process of the semiconductor chip using the silicon carbide stacked substrate according to the first embodiment of the present invention.

First, as shown in FIG. 4, the $n^{++}$ type SiC substrate 1 prepared. An n type impurity is introduced into the SiC substrate 1 at a relatively high concentration. Then type impurity is, for example, N (nitrogen), and the impurity concentration of the n type impurity is, for example, higher than $1 \times 10^{18}$ $cm^{-3}$ and $1 \times 10^{19}$ $cm^{-3}$ or lower. The main surface of the SiC substrate 1 is, for example, a {0001} plane inclined by 4 to 8 degrees in a <11-20> direction. Each of the main surface and the rear surface opposite to the main surface of the SiC substrate 1 is polished by the CMP (Chemical Mechanical Polishing) method to be a mirror surface.

Figure 5:
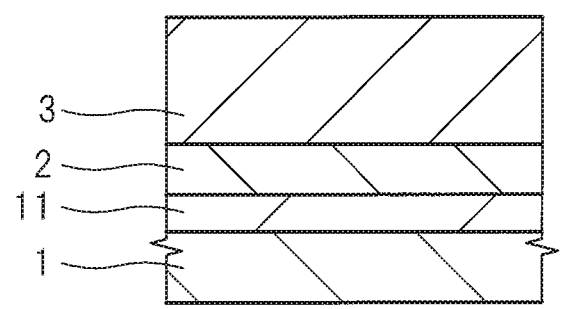
FIG. 5 is a cross-sectional view showing the manufacturing process of the semiconductor chip continued from FIG. 4.

Next, as shown in FIG. 5, the semiconductor layer 11, the buffer layer 2, and the drift layer 3 are sequentially formed on the SiC substrate 1. Namely, various semiconductor layers (epitaxial layer, epitaxial growth layer) made of SiC are sequentially formed by the epitaxial growth method as follows.

First, after the RCA cleaning of the SiC substrate 1, the SiC substrate 1 is placed on a susceptor in a furnace of a chemical vapor deposition (CVD) apparatus. Next, the furnace is evacuated to a vacuum of $1 \times 10^{-4}$ Pa or less. Subsequently, hydrogen as a carrier gas is introduced into the furnace, and the pressure in the furnace is adjusted to 1 to 30 kPa. While introducing the hydrogen in this manner, the susceptor is held until the temperature is stabilized at a set temperature. The set temperature of the susceptor is, for example, 1400 to 1700° C. Subsequently, the source gas is introduced into the furnace. Silane and propane are used as the source gas, and nitrogen is used as the impurity dopant gas. The growth of the epitaxial layer made of SiC starts with the supply of these material gases.

By performing the epitaxial growth while arbitrarily changing the gas flow rate, the set temperature of the susceptor, and the pressure in the furnace, the semiconductor layer (first epitaxial layer) 11, the buffer layer (second epitaxial layer) 2, and the drift layer (third epitaxial layer) 3 are sequentially formed on the SiC substrate 1 so as to have desired impurity concentration and film thickness.

The semiconductor layer 11 is a layer provided for improving the efficiency of the conversion of the BPD into the TED at the interface between the SiC substrate 1 and the semiconductor layer 11. This improvement of the conversion efficiency is achieved by using the property that the conversion from the BPD into the TED is likely to occur due to the concentration difference between layers in the case of the propagation from the layer with a high impurity concentration toward the layer with a low impurity concentration. Therefore, the semiconductor layer 11 is formed so as to have an impurity concentration lower than that of the SiC substrate 1.

The n type impurity concentration of the semiconductor layer 11 is higher than $1 \times 10^{16}$ $cm^{-3}$ and $1 \times 10^{17}$ $cm^{-3}$ or lower. In order to improve the efficiency of the conversion from the BPD into the TED at the interface between the SiC substrate 1 and the semiconductor layer 11, the impurity concentration of the semiconductor layer 11 is desirably low. However, since the resistance of the semiconductor layer 11 becomes higher as the concentration thereof becomes lower, the element characteristics are deteriorated in the power device in which a portion between the upper surface of the epitaxial layer and the rear surface of the substrate is used as a current path. Therefore, it is necessary that the impurity concentration of the semiconductor layer 11 is higher than $1 \times 10^{16}$ $cm^{-3}$.

Also, the film thickness of the semiconductor layer 11 is preferably 1 μm or less. This is for preventing the increase of the resistance of the semiconductor layer 11 due to the excessive increase of the thickness thereof. However, in order to stably form the film by the epitaxial growth method, the semiconductor layer 11 desirably has a large film thickness to some extent.

The buffer layer 2 needs to have a function of stopping the depletion layer expanding from the power device formed in an upper portion of the drift layer 3. Since the SiC substrate 1 has more crystal faults as compared with the epitaxial layer, when the depletion layer reaches the interface between the SiC substrate 1 and the epitaxial layer on the SiC substrate 1, the expansion of the depletion layer becomes uneven and the leakage current is generated, and it is thus necessary to prevent the depletion layer from reaching the interface. The depletion layer has the property that it is less likely to expand in the region where the epitaxial layer has a high impurity concentration. Therefore, the buffer layer 2 needs to have the impurity concentration of $1\times10^{17}$ cm$^{-3}$ or higher at which the expansion of the depletion layer can be sufficiently suppressed.

Accordingly, in this case, the n type impurity concentration of the buffer layer 2 is $1\times10^{17}$ cm$^{-3}$ or higher and lower than $1\times10^{19}$ cm$^{-3}$. Note that the case where the concentration of the semiconductor layer 11 is $1\times10^{17}$ cm$^{-3}$ or lower and the concentration of the buffer layer 2 is $1\times10^{17}$ cm$^{-3}$ or higher has been described here, but the respective layers are formed so that the impurity concentration of the semiconductor layer 11 is lower than that of the buffer layer 2 without fail. The film thickness of the buffer layer 2 can be arbitrarily set, and is, for example, about 0.5 to 8 μm.

The impurity concentration and the film thickness of the drift layer 3 are arbitrarily set depending on the specifications of the power device to be made. The impurity concentration of the drift layer 3 is, for example, $1\times10^{14}$ cm$^{-3}$ or higher and lower than $5\times10^{16}$ cm$^{-3}$. The film thickness of the drift layer 3 is, for example, 3 to 80 μm.

In the forming process of the semiconductor layer 11, the buffer layer 2, and the drift layer 3, the flow rate of the source gas, the set temperature of the susceptor, and the pressure in the furnace may be changed. Also, the supply of the source gas may be once stopped to stop the film formation after the formation of each layer is finished, and the formation of the next layer may be performed afterward by starting the supply of the source gas again. In this manner, since the formation of the next layer is started after the flow rate of the source gas, the set temperature of the susceptor, and the pressure in the furnace have been stabilized, the variations in the impurity concentration and the film thickness of the respective layers can be reduced.

After the semiconductor layer 11, the buffer layer 2, and the drift layer 3 have been all formed, the supply of the source gas is stopped, and the susceptor is cooled while introducing hydrogen into the furnace. After the temperature of the susceptor is sufficiently reduced, the introduction of the hydrogen is stopped and the furnace is evacuated, and then the susceptor is taken out. In this manner, the silicon carbide stacked substrate according to the present embodiment is completed.

Next, though not shown, a mask is formed on the upper surface of the drift layer 3. The mask is a film which exposes a part of the upper surface of the drift layer 3 in the termination region. For example, SiO$_2$ (silicon oxide) or photoresist is used as a material of the mask. Subsequently, a p type impurity (for example, aluminum (Al)) is ion-implanted into the drift layer 3 in the termination region. In this manner, the JTE region (not shown, see the JTE region 85 shown in FIG. 1) which is a p type semiconductor region is formed in the upper surface of the drift layer 3 in the termination region. The depth of the JTE region from the upper surface of the drift layer 3 is, for example, about 0.5 to 2.0 μm. Also, the impurity concentration of the JTE region is, for example, $1\times10^{16}$ cm$^{-3}$ to $5\times10^{19}$ cm$^{-3}$.

Figure 6:
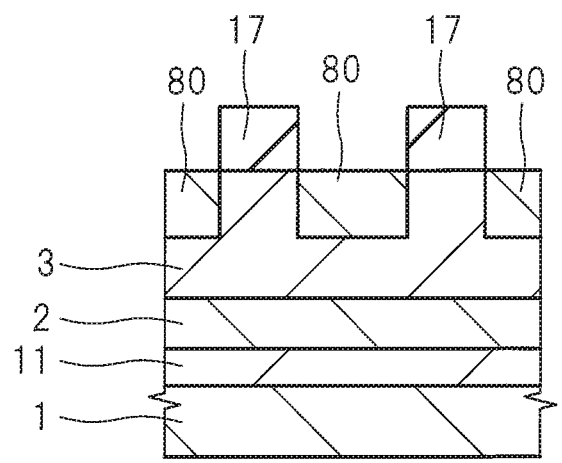
FIG. 6 is a cross-sectional view showing the manufacturing process of the semiconductor chip continued from FIG. 5.

Next, as shown in FIG. 6, the mask is removed, and then a mask 17 is formed on the upper surface of the drift layer 3. The mask 17 is a film that exposes a plurality of portions of the upper surface of the drift layer 3 in the element region. A thickness of the mask 17 is, for example, about 1.0 to 5.0 μm. For example, SiO$_2$ or photoresist is used as a material of the mask 17.

Next, a p type impurity (for example, aluminum (Al)) is ion-implanted into the drift layer 3 on which the mask 17 has been formed. In this manner, the plurality of well regions 80 which are p type semiconductor regions are formed in the upper surface of the drift layer 3 in the element region. The depth of the well region 80 from the upper surface of the drift layer 3 is, for example, about 0.5 to 2.0 μm. Also, the impurity concentration of the well region 80 is, for example, $1\times10^{16}$ cm$^{-3}$ to $1\times10^{19}$ cm$^{-3}$.

Figure 7:
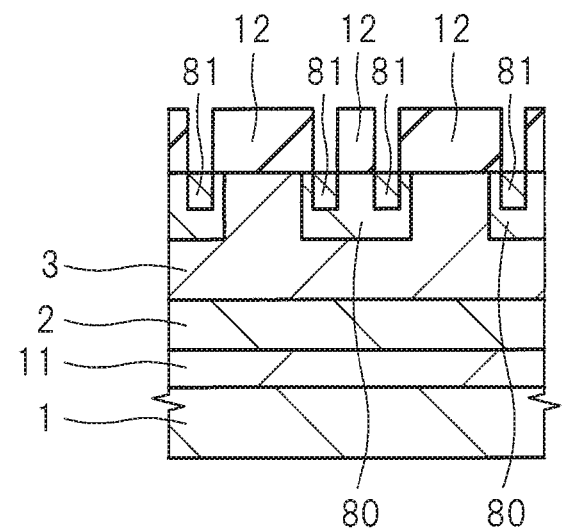
FIG. 7 is a cross-sectional view showing the manufacturing process of the semiconductor chip continued from FIG. 6.

Next, as shown in FIG. 7, the mask 17 is removed, and then a mask 12 is formed on the upper surface of the drift layer 3. A thickness of the mask 12 is, for example, about 0.5 to 2.0 μm. For example, SiO$_2$ or photoresist is used as a material of the mask 12.

Next, an n type impurity (for example, nitrogen (N)) is ion-implanted into the drift layer 3 on which the mask 12 has been formed. In this manner, the plurality of source regions 81 which are n$^+$ type semiconductor regions are formed in the upper surface of the drift layer 3 in the element region. Each source region 81 is formed at the center of the well region 80 in plan view. The depth of each source region 81 from the upper surface of the drift layer 3 is, for example, about 0.05 to 1.0 μm. Also, the impurity concentration of the source region 81 is, for example, $1\times10^{18}$ cm$^{-3}$ to $1\times10^{20}$ cm$^{-3}$.

Figure 8:
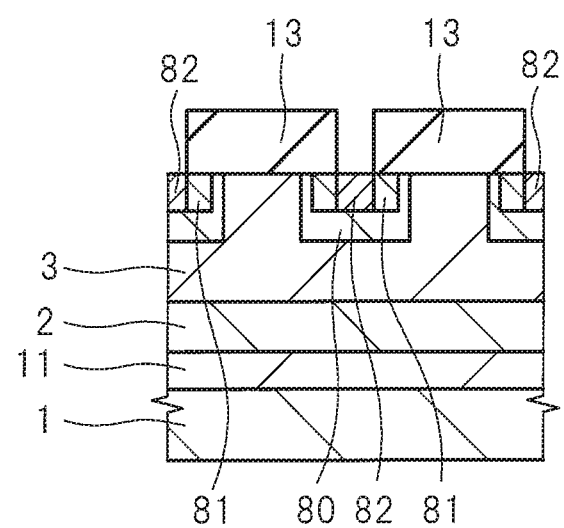
FIG. 8 is a cross-sectional view showing the manufacturing process of the semiconductor chip continued from FIG. 7.

Next, as shown in FIG. 8, the mask 12 is removed, and then a mask 13 is formed on the upper surface of the drift layer 3. A thickness of the mask 13 is, for example, about 0.5 to 2.0 μm. For example, SiO$_2$ or photoresist is used as a material of the mask 13.

Next, a p type impurity (for example, aluminum (Al)) is ion-implanted into the drift layer 3 on which the mask 13 has been formed. In this manner, the plurality of first contact regions 82 which are p$^+$ type semiconductor regions are formed in the upper surface of the drift layer 3 in the element region, and the second contact region (not shown, see the second contact region 83 shown in FIG. 1) which is a p$^+$ type semiconductor region is formed in the upper surface of the drift layer 3 in the termination region. Each first contact region 82 is formed at the center of each source region 81 in plan view. The second contact region is formed in the upper surface of the JTE region 85. The second contact region has a rectangular annular structure and is formed so as to surround the element region in plan view.

The depth of the first contact region 82 and the second contact region from the upper surface of the drift layer 3 is, for example, about 0.05 to 2.0 μm. Also, the impurity concentration of the first contact region 82 and the second contact region is, for example, $1\times10^{18}$ cm$^{-3}$ to $1\times10^{20}$ cm$^{-3}$.

Figure 9:
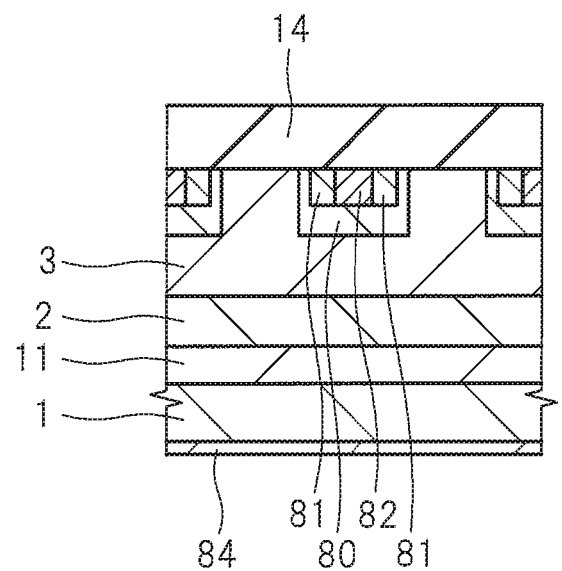
FIG. 9 is a cross-sectional view showing the manufacturing process of the semiconductor chip continued from FIG. 8.

Next, as shown in FIG. 9, the mask 13 is removed, and then a mask 14 serving as a protective film is formed on the upper surface of the drift layer 3. Thereafter, an n type impurity (for example, nitrogen (N)) is ion-implanted into the rear surface of the SiC substrate 1. In this manner, the drain region 84 which is an n$^+$ type semiconductor region is formed in the rear surface of the SiC substrate 1. The depth of the drain region 84 from the rear surface of the SiC substrate 1 is, for example, about 0.05 to 2.0 μm. Also, the impurity concentration of the drain region 84 is, for example, $1\times10^{19}$ cm$^{-3}$ to $1\times10^{21}$ cm$^{-3}$.

Next, though not shown, all of the masks are removed, and then a carbon (C) film is deposited by, for example, the plasma CVD method so as to be in contact with the upper surface of the drift layer 3 and the rear surface of the SiC substrate 1. A thickness of the carbon (C) film is, for example, about 0.03 to 0.05 µm. After covering the upper surface of the SiC drift layer 3 and the rear surface of the SiC substrate 1 with the carbon (C) film as described above, heat treatment is performed at the temperature of 1500° C. or higher for about 2 to 3 minutes. In this manner, the impurities ion-implanted into the upper surface of the SiC drift layer 3 and the rear surface of the SiC substrate 1 are activated. Thereafter, the carbon (C) film is removed by, for example, the plasma treatment.

Figure 10:
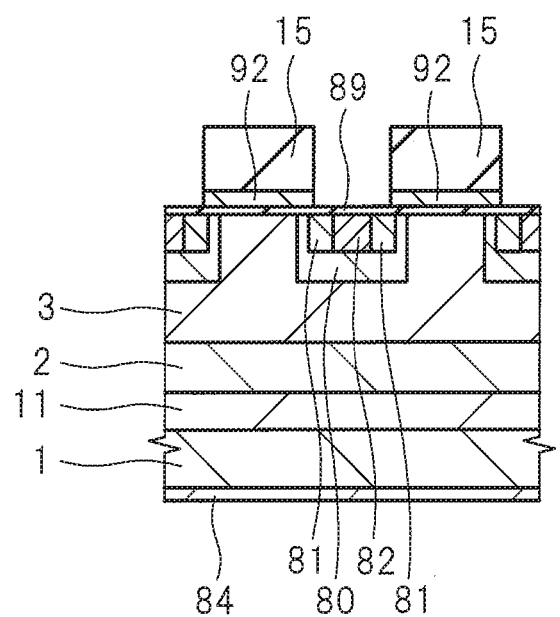
FIG. 10 is a cross-sectional view showing the manufacturing process of the semiconductor chip continued from FIG. 9.

Next, as shown in FIG. 10, an insulating film 89 and an n type polycrystalline Si film are sequentially formed on the upper surface of the drift layer 3, and then a mask 15 is formed on the polycrystalline Si film. The insulating film 89 and the polycrystalline Si film are formed by, for example, the CVD method. The mask 15 is formed between the first contact regions 82 adjacent in the upper surface of the drift layer 3. Subsequently, by processing the polycrystalline Si film by the dry etching using the mask 15, the gate electrode 92 made of the polycrystalline Si film is formed. The thickness of the insulating film 89 is, for example, about 0.05 to 0.15 µm. The thickness of the gate electrode 92 is, for example, about 0.2 to 0.5 µm.

Figure 11:
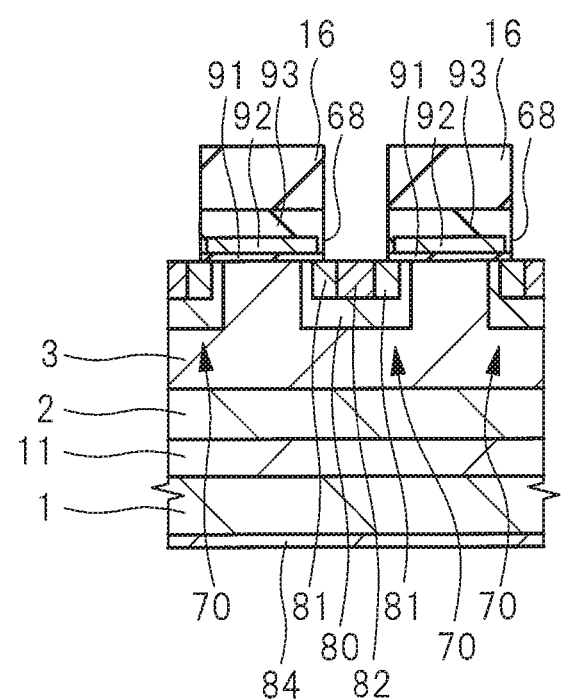
FIG. 11 is a cross-sectional view showing the manufacturing process of the semiconductor chip continued from FIG. 10.

Next, as shown in FIG. 11, the mask 15 is removed, and then the interlayer insulating film 93 is formed on the upper surface of the drift layer 3 by, for example, the plasma CVD method so as to cover the gate electrode 92 and the insulating film 89. Thereafter, by processing the interlayer insulating film 93 and the insulating film 89 by the dry etching using the mask 16, the upper surface of the drift layer 3 is exposed.

In this manner, the gate insulating film 91 made of the insulating film 89 is formed immediately below the gate electrode 92 and the interlayer insulating film 93 in the element region. In addition, by the etching described above, the opening 68 in which each upper surface of a part of the source region 81 and the first contact region 82 is exposed is formed in the interlayer insulating film 93 in the element region, and an opening (not shown) in which a part of the upper surface of the second contact region (not shown) is exposed is formed in the interlayer insulating film 93 in the termination region.

Through the process described above, the plurality of unit cells 70 which are minimum unit structures of the MOSFET are formed. Each of the plurality of unit cells 70 includes the well region 80, the source region 81, and the first contact region 82 adjacent to each other, and the gate electrode 92 formed immediately above the well region 80 with the gate insulating film 91 interposed therebetween.

Figure 12:
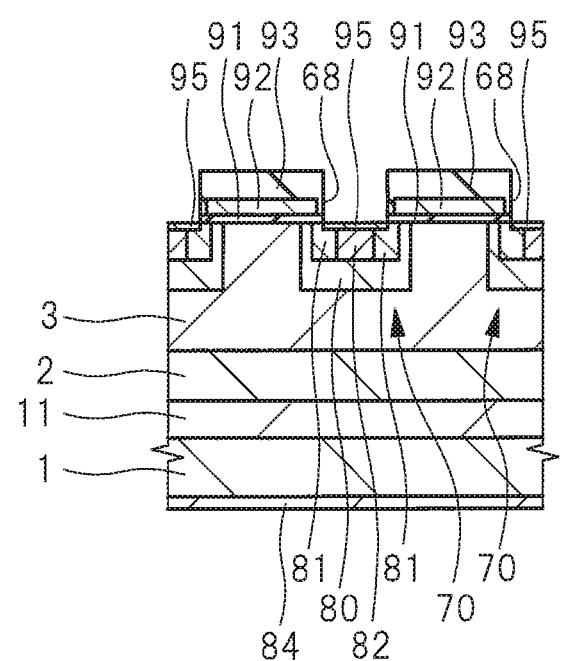
FIG. 12 is a cross-sectional view showing the manufacturing process of the semiconductor chip continued from FIG. 11.

Next, as shown in FIG. 12, the mask 16 is removed, and then the silicide layer 95 is formed at the bottom of the opening 68 in the element region, and a silicide layer (not shown) is formed at the bottom of the opening in the termination region.

When forming the silicide layer 95, first, a first metal (for example, nickel (Ni)) film is deposited by, for example, the sputtering method so as to cover the exposed drift layer 3. A thickness of the first metal film is, for example, about 0.05 µm. Subsequently, silicidation heat treatment is performed at 600 to 1000° C. to react the first metal film and the drift layer 3 with each other at the bottom of the opening 68 in the element region, thereby forming the silicide layer 95 made of, for example, nickel silicide (NiSi). With this process, the silicide layer is formed also at the bottom of the opening in the termination region.

Figure 13:
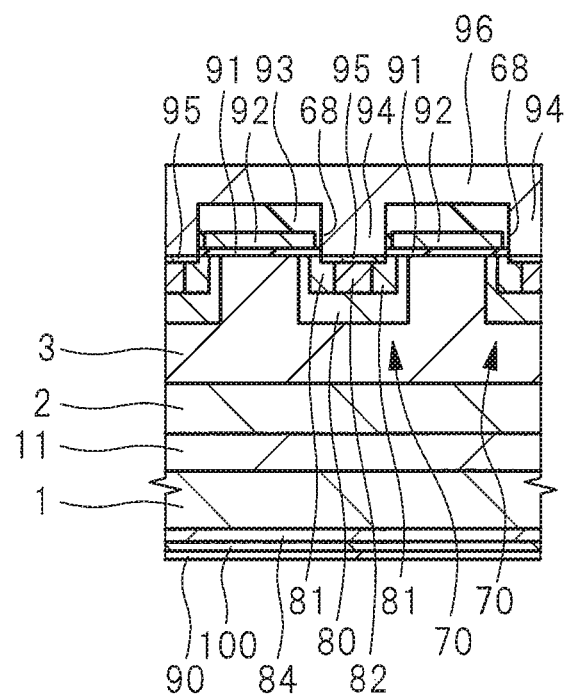
FIG. 13 is a cross-sectional view showing the manufacturing process of the semiconductor chip continued from FIG. 12.

Next, as shown in FIG. 13, a second metal (for example, titanium (Ti)) film, a titanium nitride (TiN) film, and an aluminum (Al) film are sequentially deposited on the interlayer insulating film 93 so as to fill the opening 68 reaching the silicide layer 95, the opening (not shown) reaching the silicide layer in the termination region, and the opening (not shown) reaching the gate electrode 92. Preferably, a thickness of the aluminum (Al) film is, for example, about 1.0 µm or more. Subsequently, by processing the stacked film made up of the second metal film, the titanium nitride film, and the aluminum film described above, the contact plug 94, the source wiring electrode 96, and the gate wiring electrode (not shown) composed of the stacked film are formed.

The source wiring electrode 96 or the gate wiring electrode is composed of the stacked film on the interlayer insulating film 93, and the contact plug 94 is composed of the stacked film in the opening 68. The source wiring electrode 96 is electrically connected to the first contact region 82 so as to have ohmic properties through the silicide layer 95. Also, in the termination region (not shown), the source wiring electrode 96 is connected to the second contact region through the silicide layer. In addition, the gate wiring electrode (not shown) is electrically connected to the gate electrode 92.

Next, an insulating film made of a $SiO_2$ film or a polyimide film is formed so as to cover the gate wiring electrode and the source wiring electrode 96, and the insulating film is processed to form the passivation film (not shown). The passivation film covers the termination region and has an opening in the element region.

Next, a third metal film is formed on the rear surface of the SiC substrate 1 by, for example, the sputtering method, and laser silicidation heat treatment is performed to react the third metal film and the SiC substrate 1 with each other, thereby forming the third silicide layer 100. The third silicide layer 100 is in contact with a lower surface of the drain region 84. A thickness of the third metal film is, for example, about 0.1 µm. Subsequently, the drain wiring electrode 90 is formed so as to cover the bottom surface of the third silicide layer 100. The drain wiring electrode 90 is composed of a stacked film having a thickness of 0.5 to 1.0 µm formed by sequentially stacking a titanium (Ti) film, a nickel (Ni) film, and a gold (Au) film from the side of the third silicide layer 100.

Thereafter, the SiC substrate 1 is cut and singulated by dicing process, thereby obtaining a plurality of semiconductor chips. Through the process described above, the semiconductor chip 60 according to the present embodiment including the SiC MOSFET shown in FIGS. 1, 2, and 3 is completed.

<Effect of Present Embodiment>

Next, the effect of the silicon carbide stacked substrate according to the first embodiment will be described with reference to FIGS. 17 to 19.

Figure 17:
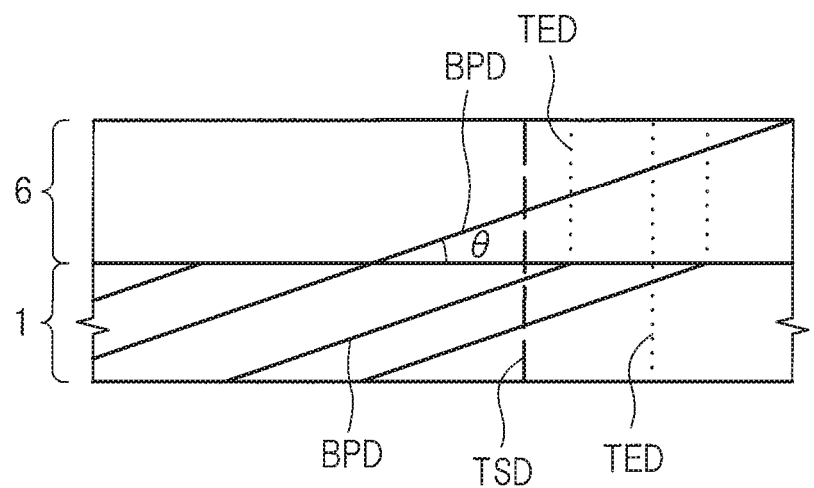
FIG. 17 is a cross-sectional view showing various kinds of faults caused in an epitaxial layer.

FIG. 17 is a cross-sectional view showing various kinds of faults caused in an epitaxial layer. FIG. 19 is a cross-sectional view of a silicon carbide stacked substrate according to a comparative example and shows a cross-sectional view of a semiconductor substrate and epitaxial layers thereon. In FIG. 17, hatching is omitted so as to make the configuration of the fault caused in the substrate and the like easily understood.

Figure 18:
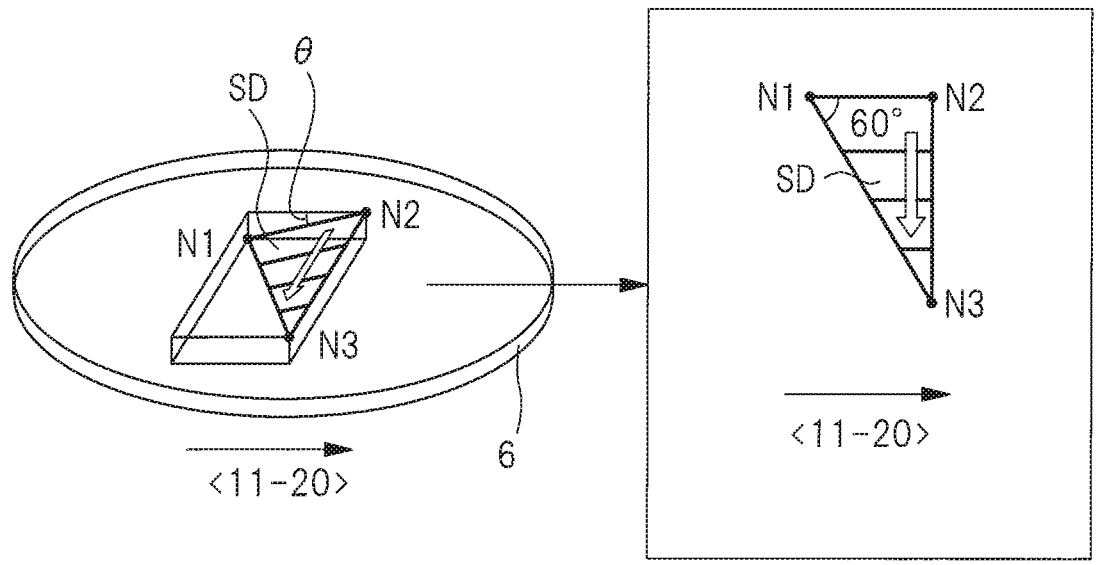
FIG. 18 is a schematic diagram of an epitaxial layer on a semiconductor substrate for describing the Shockley stacking fault caused in an epitaxial layer on a semiconductor substrate.

FIG. 18 is a schematic diagram of an epitaxial layer on a semiconductor substrate for describing the Shockley stacking fault caused in an epitaxial layer on a semiconductor substrate. On the right side of FIG. 18, a plan view of the Shockley stacking fault caused in an epitaxial layer is shown. On the left side of FIG. 18, a schematic perspective view of the silicon carbide stacking substrate (silicon carbide wafer) is shown, and a rectangular portion corresponding to a part of the semiconductor substrate is shown at the center of it. An ellipse shown on the left side of FIG. 18 is the epitaxial layer on the semiconductor substrate, and illustration of the semiconductor substrate below it is omitted. FIG. 19 is a cross-sectional view of a silicon carbide stacked substrate shown as a comparative example. In FIG. 19, as with FIG. 2, the cross section of the silicon carbide stacked substrate is shown on the left side, and the graph of the impurity concentration of the substrate and the epitaxial layer is shown on the right side.

Linear faults present in the crystal of 4H—SiC used for the element manufacturing include the BPD (Basal Plane Dislocation) to be the core of the growth of stacking fault, and further include the TSD (Threading Screw Dislocation) and the TED (Threading Edge Dislocation). Here, FIG. 17 shows the state of propagation of the linear fault included in the substrate in the epitaxial growth. FIG. 17 shows the SiC substrate 1 and an epitaxial layer 6 formed on the SiC substrate 1 and including a drift layer. In FIG. 17, a solid line indicates the BPD, a broken line indicates the TSD, and a dotted line indicates the TED.

The BPD is originally present in the substrate, and a large number of BPDs are present in the SiC substrate 1 as indicated by solid lines in FIG. 17. Some of the large number of BPDs are converted into the TEDs and propagate to the epitaxial layer 6 during the epitaxial growth. On the other hand, some of the other BPDs may propagate to the epitaxial layer 6 without being converted into the TEDs.

In this case, as the method of the epitaxial growth of SiC in the silicon carbide stacked substrate in which the epitaxial layer 6 is formed on the SiC substrate 1, the step flow growth is used on a surface in which the crystal axis is inclined by several degrees (for example, 4 degrees or 8 degrees) in the <11-20> direction from the {0001} basal plane. Therefore, the BPD which is originally present in the SiC substrate 1 and becomes the core of the growth of stacking fault propagates in an oblique direction inclined by several degrees from the main surface of the SiC substrate 1 in the epitaxially grown layer (epitaxial layer, drift layer).

The TED and TSD are dislocations which propagate in the direction perpendicular to the main surface of the SiC substrate 1, and do not cause the increase of element resistance and forward voltage of the semiconductor device. Also, the TED and TSD are dislocations having no expandability to the stacking fault. Therefore, the TED and TSD are harmless faults which do not adversely affect the characteristics of the semiconductor device as compared with the BPD. Meanwhile, the BPD is a fault which is expanded by passing a current and causes the increase of the resistance of the silicon carbide stacked substrate and the semiconductor device as described below.

Next, the shape of the stacking fault grown in the epitaxial layer from the BPD expanded from the SiC substrate to the epitaxial layer will be described with reference to FIG. 18. As shown in FIG. 18, the BPD formed in the vicinity of the interface between the SiC substrate and the epitaxial layer 6 is generated from a vertex N1 on the side of the SiC substrate as a base point, and is linearly formed in the epitaxial layer 6 between the vertex N1 and a vertex N2 of the upper surface of the epitaxial layer 6. This linear fault (BPD) is formed in an oblique direction at an off angle θ formed between the main surface of the SiC substrate and the {0001} basal plane. The linear BPD grows in the <11-20> direction from the vertex N1 as the base point to the vertex N2 in plan view.

Herein, when electrons and holes injected by passing a current to the pn junction in the drift layer 3 are re-coupled in the BPD, the linear BPD is laterally expanded by the emitted energy and is converted into the Shockley stacking fault (plane fault).

As indicated by the white arrow in FIG. 18, the Shockley stacking fault SD gradually grows toward a vertex N3 of the upper surface of the epitaxial layer 6 in plan view, and the growth stops at the time of reaching the vertex N3. Namely, the Shockley stacking fault SD has a trapezoidal shape during the growth, and becomes a right triangle at the end of the growth. The right triangle has, for example, an angle of 90 degrees at the vertex N2, an angle of 60 degrees at the vertex N1, and an angle of 30 degrees at the vertex N3. Specifically, among the three sides of the right triangle, the side between the vertexes N2 and N3 is present on the upper surface of the epitaxial layer 6.

Since the SiC power element is a vertical-type element in which current flows from the front surface of the drift layer (source region) to the rear surface (drain region), the current path is almost perpendicular to the {0001} basal plane. The Shockley stacking fault SD shown in FIG. 18 behaves like a quantum well with respect to the <0001> direction and works as an electron trap. Therefore, the region in which the Shockley stacking fault SD is formed has a higher resistance than the normal region.

Accordingly, when current flows perpendicularly to the Shockley stacking fault SD, the element resistance (substrate resistance) is consequently increased. Also, even when the current flows while avoiding the Shockley stacking fault SD, the area where the current flows decreases and the current density increases, so that the element resistance (substrate resistance) and the forward voltage (on-voltage) increase with the passage of the current applying time. Namely, a problem that the resistance between the source and the drain and the resistance of the built-in diode increase with the passage of the current applying time arises in the MOSFET. Specifically, the resistance of the silicon carbide stacked substrate and the semiconductor device is increased.

However, in the pn diode for high withstand voltage or the IGBT, it is necessary to pass a current to the pn junction for reducing the conduction loss. Also, in the case of the diode-less operation for the purpose of reducing the size and weight of the device in an all-SiC power module in which transistors and diodes are formed on a SiC substrate, it is necessary to pass a current to the pn junction of the built-in diode of the MOSFET, and thus a problem of the increase of element resistance arises in the SiC element.

Note that the diode-less operation mentioned here indicates that a built-in diode is made to play a role of a diode (for example, Schottky barrier diode) connected in anti-parallel to a transistor in an inverter. In this manner, since it becomes unnecessary to mixedly mount the diode in the chip including the transistor and further to prepare the chip in which the diode is mounted separately from the chip including the transistor, the size and weight reduction of the device can be achieved.

When the element resistance increases, the voltage required for passing a current with a predetermined value to the semiconductor device increases. Namely, the increase of the element resistance hinders the power saving of the semiconductor device. Further, the increase of the element resistance (substrate resistance) becomes more remarkable as the current flowing to the pn junction in the SiC semiconductor substrate becomes larger, and therefore, the element resistance increases with the passage of the current applying time of the semiconductor device. Specifically, the current-carrying properties are deteriorated. Therefore, a problem that the characteristics of the semiconductor device cannot be maintained for a long period of time arises.

Methods of preventing the increase of substrate resistance and element resistance due to the expansion of the Shockley stacking fault SD include a method of increasing the efficiency of converting the BPD, which propagates from the side of the SiC substrate toward the side of the epitaxial layer, into the harmless TED, which does not contribute to the increase of element resistance, at the interface between the SiC substrate and the epitaxial layer. Even when a current flows to the TED formed by the conversion of the BPD, the TED does not expand and the element resistance does not increase.

Herein, as a property of the 4H—SiC crystal having the hexagonal structure, when the impurity concentration thereof is increased to increase the impurity substitution to the Si (silicon) site or the C (carbon) site, the lattice constants in the a-plane direction and the c-plane direction change. Also, as a property at the interface between the layer having the BPD and a high impurity concentration and the layer having a low impurity concentration, the stress acts due to the difference in lattice constant caused by the difference in impurity concentration, and the efficiency of the conversion of the BPD into the TED improves in the layer having a low impurity concentration.

Namely, when an epitaxial layer having a low impurity concentration is formed on a SiC substrate having the BPD and a high impurity concentration, the BPD is converted into the TED at the interface between the SiC substrate and the epitaxial layer, and the conversion efficiency thereof becomes higher as the concentration difference between the SiC substrate and the epitaxial layer becomes larger. In other words, in order to effectively improve the efficiency of conversion of the BPD into the TED, it is necessary to sufficiently increase the concentration difference between the SiC substrate and the epitaxial layer.

Figure 19:
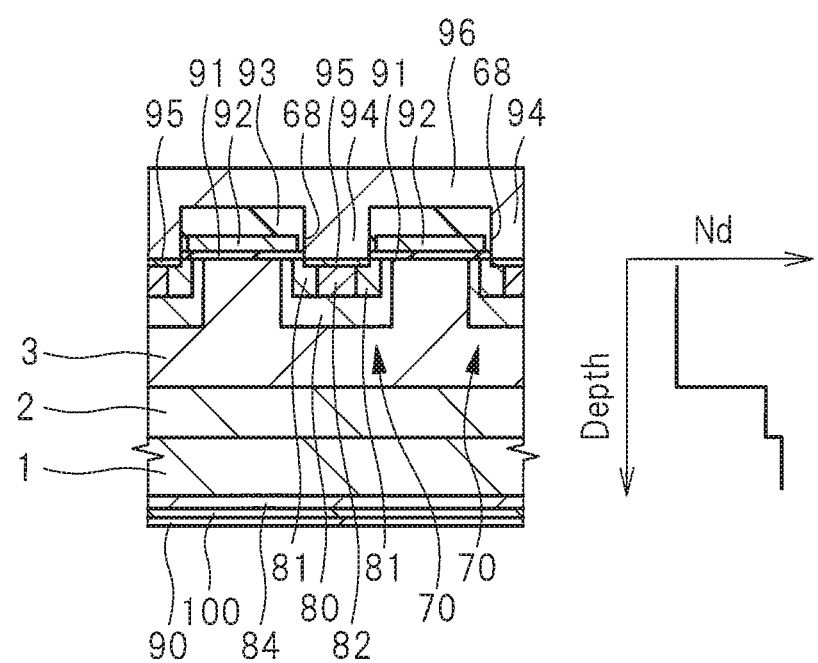
FIG. 19 is a cross-sectional view of a silicon carbide stacked substrate according to a comparative example.

Herein, FIG. 19 shows the silicon carbide stacked substrate according to a comparative example. As shown in FIG. 19, the silicon carbide stacked substrate according to the comparative example includes the SiC substrate 1 and the buffer layer (depletion barrier layer) 2 and the drift layer 3 sequentially formed on the SiC substrate 1. The buffer layer 2 and the drift layer 3 are epitaxial layers. The n$^+$ type buffer layer 2 has an n type impurity concentration lower than that of the n$^{++}$ type SiC substrate 1, and has an n type impurity concentration higher than that of the n$^{--}$ type drift layer 3.

The buffer layer 2 is a layer formed to stop the depletion layer expanding from the power device formed in an upper portion of the drift layer 3. Therefore, the buffer layer 2 needs to have an impurity concentration of $1 \times 10^{17}$ cm$^{-3}$ or higher in order to sufficiently suppress the expansion of the depletion layer.

In the comparative example described above, since the buffer layer 2 formed on the SiC substrate 1 has an impurity concentration lower than that of the SiC substrate 1, it seems that the BPD is converted into the TED at the interface between the SiC substrate 1 and the buffer layer 2 and the increase of element resistance due to the expansion of the BPD is suppressed. However, as described above, the buffer layer 2 is a layer having a high impurity concentration in order to stop the depletion layer expanding from the inside of the drift layer 3, and the difference in impurity concentration between the buffer layer 2 and the SiC substrate 1 is small. Therefore, even when the buffer layer 2 has an impurity concentration lower than that of the SiC substrate 1, the conversion efficiency from the BPD into the TED is hardly improved, and the problem of the increase of the element resistance due to the expansion of the BPD is not solved.

Therefore, in the present embodiment, as shown in FIG. 2, the semiconductor layer (basal plane dislocation conversion layer) 11 which is an epitaxial layer in contact with the upper surface of the SiC substrate 1 is provided between the n$^{++}$ type SiC substrate 1 and the n$^+$ type buffer layer 2. Since the semiconductor layer 11 is made of n$^-$ type semiconductor having an n type impurity concentration lower than those of the SiC substrate 1 and the buffer layer 2, the BPD propagating from the side of the SiC substrate 1 toward the side of the epitaxial layers including the semiconductor layer 11, the buffer layer 2, and the drift layer 3 can be efficiently converted into the TED at the interface between the SiC substrate 1 and the semiconductor layer 11 as compared with the silicon carbide stacked substrate according to the comparative example described with reference to FIG. 19.

In this manner, since the conversion efficiency from the BPD into the TED can be sufficiently improved even in the silicon carbide stacked substrate having the buffer layer 2 which is a depletion barrier layer, the propagation of the BPD to the epitaxial layer can be suppressed while preventing the expansion of the depletion layer. Therefore, even when the power element which passes a current in the direction perpendicular to the main surface of the SiC substrate 1 is formed in the upper portion of the drift layer 3, it is possible to prevent the expansion of the BPD into the plane fault as the Shockley stacking fault due to the current in the epitaxial layer.

Also, from the viewpoint of improving the efficiency of the conversion of the BPD into the TED, it is desirable to increase the concentration difference between the semiconductor layer 11 and the SiC substrate 1 by making the impurity concentration of the SiC substrate 1 higher than that of the buffer layer 2.

Also, since the present embodiment aims to improve the efficiency of conversion of the BPD into the TED by increasing the impurity concentration difference between the SiC substrate 1 and the semiconductor layer 11 at the interface therebetween, it is only necessary that the upper surface of the SiC substrate 1 has a concentration higher than that of the semiconductor layer 11, and the impurity concentration in the SiC substrate 1 below the upper surface of the SiC substrate 1 may be lower than that of the upper surface. Such a configuration will be described in a second modification of a second embodiment described later.

Herein, when the impurity concentration of the semiconductor layer 11 is lower than that of the n$^{--}$ type drift layer 3, the impurity concentration of the semiconductor layer 11 is excessively low, and thus the semiconductor layer 11 has high resistance. In this case, in the power element that passes a current in the direction perpendicular to the main surface of the SiC substrate 1 as with the MOSFET shown in FIG. 2, the resistance value between the source region 81 and the drain region 84 increases, and thus the problem of the deterioration of the element characteristics arises. Specifically, when the n type impurity concentration of the semiconductor layer 11 becomes $1 \times 10^{16}$ cm$^{-3}$ or lower, the problem of the increase of the resistance value of the semiconductor layer 11 becomes obvious.

Therefore, in the silicon carbide stacked substrate according to the present embodiment, the impurity concentration of the semiconductor layer 11 is set to be higher than that of the drift layer 3. Specifically, the n type impurity concentration of the semiconductor layer 11 is higher than $1 \times 10^{16}$ cm$^{-3}$ and $1\times10^{17}$ cm$^{-3}$ or lower. In this manner, it is possible to prevent the increase of the resistance value of the semiconductor layer 11.

Therefore, in the present embodiment, it is possible to prevent the increase of the resistance of the silicon carbide stacked substrate due to the growth of the BPD caused by passing a current and the increase of the resistance of the silicon carbide stacked substrate due to the reduction of the concentration of the semiconductor layer 11. Namely, since it is possible to prevent the deterioration of the characteristics of each of the silicon carbide stacked substrate and the semiconductor device by using the semiconductor device including the silicon carbide stacked substrate, the reliability of the silicon carbide stacked substrate can be improved.

In the present embodiment, since the propagation of the basal plane dislocation (BPD) to the epitaxial layer can be suppressed, the basal plane dislocation density of the drift layer 3 is 5 defects/cm$^2$ or less.

(Second Embodiment)

Figure 14:
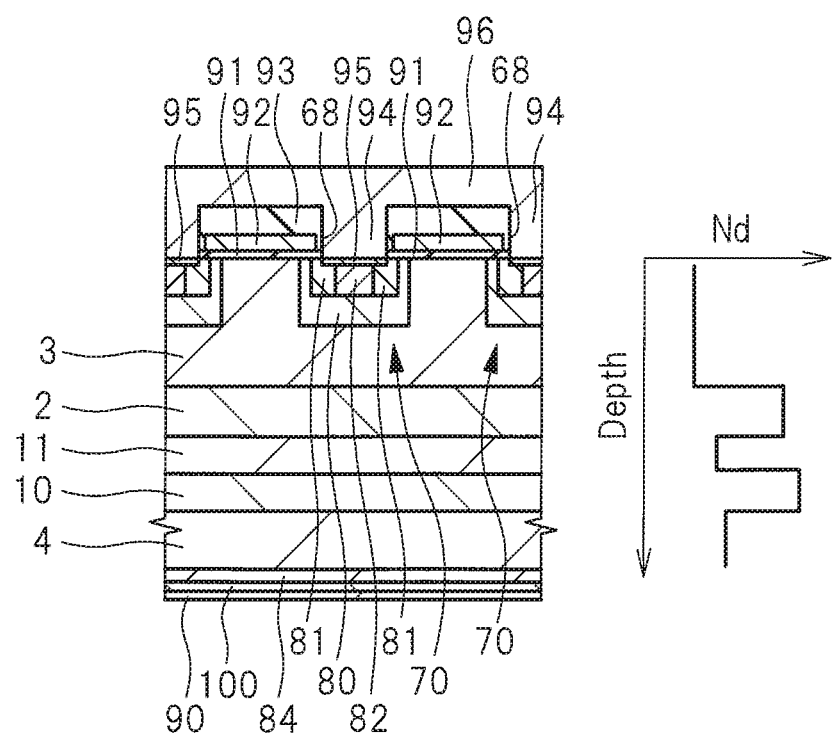
FIG. 14 is a cross-sectional view of a semiconductor chip using a silicon carbide stacked substrate according to a second embodiment of the present invention.

In the second embodiment, the case where a substrate having a relatively low n type impurity concentration is used as a SiC substrate will be described. Herein, FIG. 14 shows a cross-sectional view of a semiconductor chip using a silicon carbide stacked substrate according to the present embodiment. In FIG. 14, as with FIG. 2, the cross-sectional view of the semiconductor chip is shown on the left side, and the graph of the relationship between the depth direction of the cross-sectional structure shown on the left side of FIG. 14 and the impurity concentration (Nd) is shown on the right side. This graph shows only the impurity concentration of each of a SiC substrate 4, a semiconductor layer 10, the semiconductor layer 11, the buffer layer 2, and the drift layer 3 and does not show the impurity concentrations of other portions where the contact region, the well region, the source region, the drain region, and others are formed.

The silicon carbide stacked substrate according to the present embodiment is different from the first embodiment described above in that the SiC substrate 4 having a low concentration shown in FIG. 14 is used and the semiconductor layer 10 having an impurity concentration higher than those of the semiconductor substrate 11 and the SiC substrate 4 is formed between the SiC substrate 4 and the semiconductor substrate 11, and the other structure thereof is the same as the first embodiment described above.

As shown in FIG. 14, the silicon carbide stacked substrate according to the present embodiment includes the SiC substrate 4 having a low concentration. The concentration of the n type impurity (for example, N (nitrogen)) of the n type SiC substrate 4 is, for example, $5\times10^{17}$ cm$^{-3}$ or lower. The main surface of the SiC substrate 4 is, for example, a {0001} plane inclined by 4 to 8 degrees in a <11-20> direction.

As described above, the impurity concentration of the SiC substrate 4 is lower than that of the n$^+$ type buffer layer 2. Note that the case where the impurity concentration of the SiC substrate 4 is higher than that of the n$^-$ type semiconductor layer 11 will be described here, but the impurity concentration of the SiC substrate 4 may be lower than that of the semiconductor layer 11. The SiC substrate 4 having a low concentration has a property of less internal BPDs than the SiC substrate having a high concentration. Therefore, by using the SiC substrate 4 having a low concentration, the BPDs propagating to the epitaxial layer formed on the SiC substrate 4 can be reduced. Accordingly, since the density of the BPDs in the epitaxial layer can be reduced, it is possible to prevent the increase of the resistance of the silicon carbide stacked substrate due to the growth of the BPD.

However, when the SiC substrate 1 is replaced with the SiC substrate 4 according to the present embodiment in the case where the SiC substrate 1 (see FIG. 2) and the semiconductor layer 11 (see FIG. 2) are in contact with each other as in the first embodiment described above, the concentration difference of the n type impurity between the SiC substrate 4 and the semiconductor layer 11 becomes very small. Therefore, it is not possible to obtain the effect of improving the conversion efficiency of the BPD into the TED by providing the semiconductor layer 11 of the first embodiment described above.

Accordingly, in the present embodiment, the n$^{++}$ type semiconductor layer (basal plane dislocation conversion layer, epitaxial layer) 10 which is an epitaxial layer having an impurity concentration higher than those of the semiconductor layer 11 and the SiC substrate 4 is formed between the SiC substrate 4 and the semiconductor layer 11. Herein, the case where the n$^{++}$ type semiconductor layer 10 has an impurity concentration higher than that of the n$^+$ type buffer layer 2 will be described, but the impurity concentration of the semiconductor layer 10 may be equal to that of the buffer layer 2. Namely, each of the buffer layer 2 and the semiconductor layer 10 has an impurity concentration of $1\times10^{17}$ cm$^{-3}$ or higher. However, the impurity concentration of the upper surface of the semiconductor layer 10 is always higher than that of the semiconductor layer 11.

In this manner, since the concentration difference of the n type impurity between the semiconductor layer 10 having a high concentration and the semiconductor layer 11 having a low concentration becomes sufficiently large, the BPD propagating from the inside of the SiC substrate 4 to the epitaxial layer on the SiC substrate 4 is likely to be converted into the TED at the interface between the semiconductor layer 10 and the semiconductor layer 11 having a low concentration. As a result, since the efficiency of the conversion of the BPD into the TED can be effectively improved, it is possible to prevent the propagation of the BPD to each of the semiconductor layer 11, the buffer layer 2, and the drift layer 3 which are the epitaxial layers on the semiconductor layer 10. Accordingly, it is possible to prevent the increase of the resistance of the silicon carbide stacked substrate due to the growth of the BPD.

In the manufacturing method of the silicon carbide stacked substrate according to the present embodiment, first, the SiC substrate 4 having a low concentration is prepared. An n type impurity is introduced into the SiC substrate 4 at a relatively low concentration. The n type impurity is, for example, N (nitrogen), and the impurity concentration thereof is, for example, $5\times10^{17}$ cm$^{-3}$ or lower. The main surface of the SiC substrate 4 is, for example, a {0001} plane inclined by 4 to 8 degrees in a <11-20> direction. Each of the main surface and the rear surface opposite to the main surface of the SiC substrate 4 is polished by the CMP method to be a mirror surface.

Next, the semiconductor layer 10, the semiconductor layer 11, the buffer layer 2, and the drift layer 3 are sequentially formed on the SiC substrate 4. Namely, various semiconductor layers (epitaxial layer, epitaxial growth layer) made of SiC are sequentially formed by the epitaxial growth method as follows. The forming process of the epitaxial layers is different from the first embodiment described above only in that the step of forming the semiconductor layer 10 on the SiC substrate 4 is performed before forming the semiconductor layer 11. Namely, by performing the epitaxial growth while arbitrarily changing the flow rate of the gas introduced into the furnace of the CVD apparatus, the set temperature of the susceptor, and the pressure in the furnace, the semiconductor layer 10, the semiconductor layer 11, the buffer layer 2, and the drift layer 3 are sequentially formed on the SiC substrate 4 so as to have desired impurity concentration and film thickness.

The semiconductor layer 10 is a layer provided for improving the efficiency of the conversion of the BPD into the TED at the interface between the semiconductor layer 10 and the semiconductor layer 11. Therefore, the semiconductor layer 10 is formed as a layer having an impurity concentration higher than those of the SiC substrate 4 and the semiconductor layer 11, and then, the semiconductor layer 11 is formed as a layer having an impurity concentration lower than that of the semiconductor layer 10. Specifically, the n type impurity concentration of the semiconductor layer 10 is $1 \times 10^{17}$ cm$^{-3}$ or higher, and the n type impurity concentration of the semiconductor layer 11 is higher than $1 \times 10^{16}$ cm$^{-3}$ and $1 \times 10^{17}$ cm$^{-3}$ or lower. Note that the film thickness of the semiconductor layer 10 is, for example, 0.5 to 10 μm.

Also in this case, in order to prevent the increase of the resistance of the semiconductor layer 11, the impurity concentration of the semiconductor layer 11 is set to be higher than that of the drift layer 3 formed later. Specifically, the impurity concentration of the semiconductor layer 11 is made higher than $1 \times 10^{16}$ cm$^{-3}$. The film thickness of the semiconductor layer 11 is 1 μm.

Thereafter, the buffer layer 2 and the drift layer 3 are formed in the same manner as the first embodiment described above, so that the silicon carbide stacked substrate according to the present embodiment is completed. Subsequently, by performing the same process as that described with reference to FIGS. 6 to 13, the semiconductor chip using the silicon carbide stacked substrate according to the present embodiment can be formed.

In the silicon carbide stacked substrate formed through the process described above, by using the SiC substrate 4 having a low concentration, the BPD present in the SiC substrate 4 can be reduced, and the BPD propagating to the epitaxial layer formed on the SiC substrate 4 can be reduced. Also, by forming the semiconductor layer 10 having a high concentration and the semiconductor layer 11 having a low concentration in contact with the upper surface of the semiconductor layer 10, the conversion efficiency of the BPD into the TED at the interface between the semiconductor layer 10 and the semiconductor layer 11 can be improved. Therefore, since it is possible to prevent the BPD from propagating to the inside of the buffer layer 2 and the drift layer 3, it is possible to prevent the increase of the resistance of the silicon carbide stacked substrate due to the growth of the BPD.

<First Modification>

Figure 15:
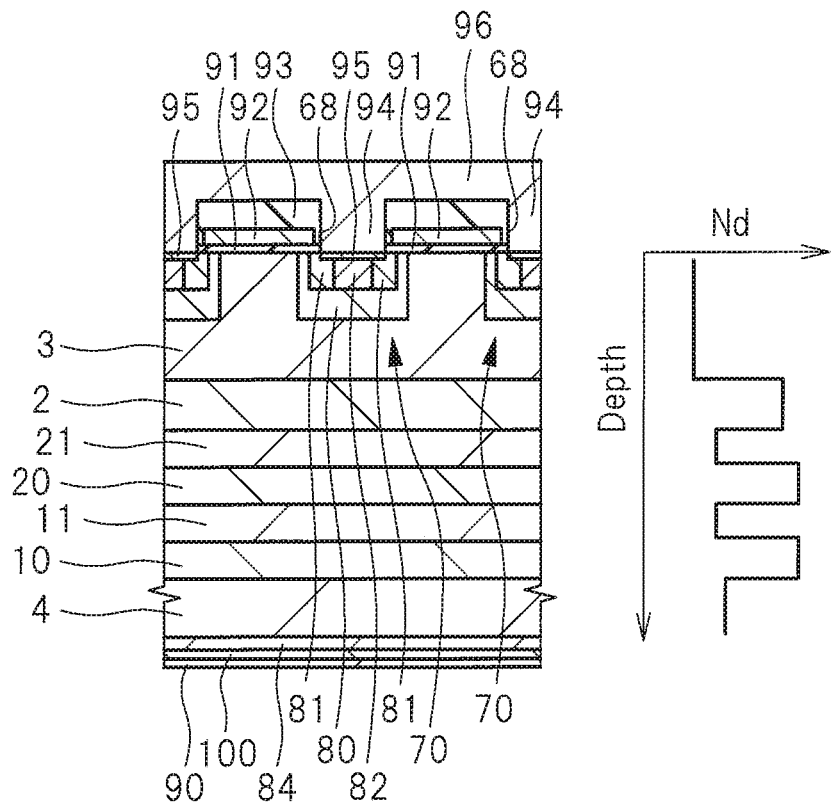
FIG. 15 is a cross-sectional view of a semiconductor chip using a silicon carbide stacked substrate according to a first modification of the second embodiment of the present invention.

In the first modification, the case where a substrate having a relatively low n type impurity concentration is used as a SiC substrate and a stacked pattern in which a high concentration layer and a low concentration layer are sequentially formed is repeatedly formed a plurality of times on the substrate will be described. Herein, FIG. 15 shows a cross-sectional view of a semiconductor chip using a silicon carbide stacked substrate according to this modification. In FIG. 15, as with FIG. 2, the cross-sectional view of the semiconductor chip is shown on the left side, and the graph of the relationship between the depth direction of the cross-sectional structure shown on the left side of FIG. 15 and the impurity concentration is shown on the right side. This graph shows only the impurity concentration of each of the SiC substrate 4, the semiconductor layer 10, the semiconductor layer 11, a semiconductor layer 20, a semiconductor layer 21, the buffer layer 2, and the drift layer 3 and does not show the impurity concentrations of other portions where the contact region, the well region, the source region, the drain region, and others are formed.

The silicon carbide stacked substrate according to this modification is different from the silicon carbide stacked substrate described with reference to FIG. 14 in that a stacked structure made up of the semiconductor layer 20 having a high concentration and the semiconductor layer 21 having a low concentration, the structure being the same stacked structure made up of the semiconductor layer 10 having a high concentration and the semiconductor layer 11 having a low concentration shown in FIG. 14, is further provided on the semiconductor layer 11 as shown in FIG. 15. The structure of the semiconductor chip shown in FIG. 15 is the same as the semiconductor chip described with reference to FIG. 14 except that the semiconductor layer 20 and the semiconductor layer 21 are provided.

As shown in FIG. 15, the silicon carbide stacked substrate according to this modification has the SiC substrate 4 having a low concentration. The concentration of the n type impurity (for example, N (nitrogen)) of the n type SiC substrate 4 is, for example, $5 \times 10^{17}$ cm$^{-3}$ or lower. The main surface of the SiC substrate 4 is, for example, a {0001} plane inclined by 4 to 8 degrees in a <11-20> direction. In this manner, by using the SiC substrate 4 having a low concentration, it is possible to reduce the BPD propagating to the epitaxial layer formed on the SiC substrate 4.

Also, as with the silicon carbide stacked substrate described with reference to FIG. 14, by providing the stacked structure made up of the semiconductor layer 10 having a high concentration and the semiconductor layer 11 having a low concentration, the BPD propagating from the inside of the SiC substrate 4 to the epitaxial layer on the SiC substrate 4 is likely to be converted into the TED at the interface between the semiconductor layer 10 and the semiconductor layer 11 having a low concentration.

Also, as a feature of this modification, the semiconductor layer (basal plane dislocation conversion layer, epitaxial layer) 20 having a high impurity concentration equal to that of the semiconductor layer 10 is formed on the semiconductor layer 11, and the semiconductor layer (basal plane dislocation conversion layer, epitaxial layer) 21 having a low impurity concentration equal to that of the semiconductor layer 11 is formed on the semiconductor layer 20 so as to be in contact with the upper surface of the semiconductor layer 20. Therefore, the BPD propagating from the inside of the SiC substrate 4 to the epitaxial layer on the SiC substrate 4 is likely to be converted into the TED at the interface between the semiconductor layer 20 and the semiconductor layer 21 having a low concentration.

The n type impurity concentration of the semiconductor layer 20 is $1 \times 10^{17}$ cm$^{-3}$ or higher, and the n type impurity concentration of the semiconductor layer 21 is higher than $1 \times 10^{16}$ cm$^{-3}$ and $1 \times 10^{17}$ cm$^{-3}$ or lower. The film thickness of the semiconductor layer 20 is, for example, 0.5 to 10 μm and the film thickness of the semiconductor layer 21 is 1 μm.

Also in this case, in order to prevent the increase of the resistance of the semiconductor layer 21, the impurity concentration of the semiconductor layer 21 is set to be higher than that of the drift layer 3 formed later. Specifically, the impurity concentration of the semiconductor layer 21 is made higher than $1 \times 10^{16}$ cm$^{-3}$.

As described above, in this modification, a plurality of stacked structures in which a semiconductor layer having a high concentration and a semiconductor layer having a low concentration are stacked are formed on the SiC substrate 4 so as to be overlapped with each other. Note that the configuration in which two stacked structures are overlapped has been described here, but the number of stacked structures may be any plural number (n structures (n is a positive integer)). In this manner, the conversion efficiency of the BPD propagating from the inside of the SiC substrate 4 to the epitaxial layer on the SiC substrate 4 into the TED can be improved not only at the interface between the semiconductor layer 10 and the semiconductor layer 11 having a low concentration but also at the interface between the semiconductor layer 20 and the semiconductor layer 21 having a low concentration. Therefore, the conversion efficiency of the BPD into the TED can be further improved as compared with the structure described with reference to FIG. 14. In this manner, it is possible to prevent the increase of the resistance of the silicon carbide stacked substrate due to the growth of the BPD.

In the manufacturing method of the silicon carbide stacked substrate according to this modification, in addition to the manufacturing process of the silicon carbide stacked substrate described with reference to FIG. 14, the semiconductor layers 20 and 21 are sequentially formed on the semiconductor layer 11 after forming the semiconductor layer 11.

The semiconductor layer 20 is a layer provided for improving the efficiency of the conversion of the BPD into the TED at the interface between the semiconductor layer 20 and the semiconductor layer 21. Therefore, the semiconductor layer 20 is formed as a layer having an impurity concentration higher than those of the SiC substrate 4 and the semiconductor layer 21, and then, the semiconductor layer 21 is formed as a layer having an impurity concentration lower than that of the semiconductor layer 20. Specifically, the n type impurity concentration of the semiconductor layer 20 is $1 \times 10^{17}$ cm$^{-3}$ or higher, and the n type impurity concentration of the semiconductor layer 21 is higher than $1 \times 10^{16}$ cm$^{-3}$ and $1 \times 10^{17}$ cm$^{-3}$ or lower. The film thickness of the semiconductor layer 20 is, for example, 0.5 to 10 μm, and the film thickness of the semiconductor layer 21 is 1 μm.

Also in this case, in order to prevent the increase of the resistance of the semiconductor layer 11, the impurity concentration of the semiconductor layer 11 is set to be higher than that of the drift layer 3 formed later. Specifically, the impurity concentration of the semiconductor layer 11 is made higher than $1 \times 10^{16}$ cm$^{-3}$. Thereafter, the buffer layer 2 and the drift layer 3 are formed in the same manner as the first embodiment described above, so that the silicon carbide stacked substrate according to this modification is completed. Subsequently, by performing the same process as that described with reference to FIGS. 6 to 13, the semiconductor chip using the silicon carbide stacked substrate according to this modification can be formed.

In the silicon carbide stacked substrate formed through the process described above, by using the SiC substrate 4 having a low concentration, the BPD present in the SiC substrate 4 can be reduced, and the BPD propagating to the epitaxial layer formed on the SiC substrate 4 can be reduced. Further, by overlapping a plurality of stacked structures each made up of a semiconductor layer having a high concentration and a semiconductor layer having a low concentration, the conversion efficiency of the BPD into the TED can be improved. Therefore, since it is possible to prevent the BPD from propagating to the inside of the buffer layer 2 and the drift layer 3, it is possible to prevent the increase of the resistance of the silicon carbide stacked substrate due to the growth of the BPD.

<Second Modification>

Figure 16:
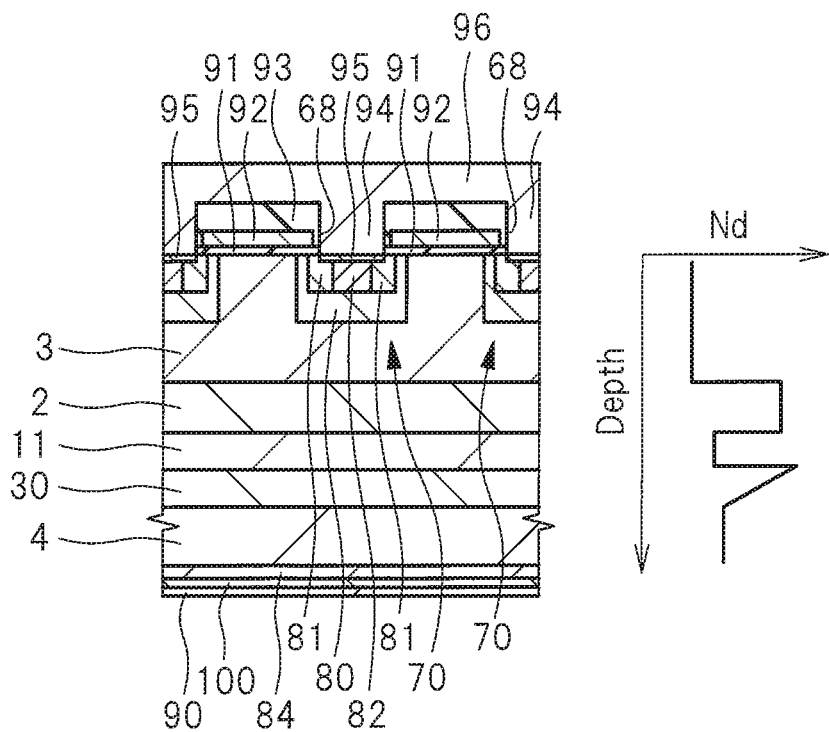
FIG. 16 is a cross-sectional view of a semiconductor chip using a silicon carbide stacked substrate according to a second modification of the second embodiment of the present invention.

In this second modification, the case where a substrate having a relatively low n type impurity concentration is used as a SiC substrate and a semiconductor layer having a concentration gradient in which the concentration gradually increases upward and a layer having a low concentration are sequentially formed on the substrate will be described. Herein, FIG. 16 shows a cross-sectional view of a semiconductor chip using a silicon carbide stacked substrate according to this modification. In FIG. 16, as with FIG. 2, the cross-sectional view of the semiconductor chip is shown on the left side, and the graph of the relationship between the depth direction of the cross-sectional structure shown on the left side of FIG. 16 and the impurity concentration is shown on the right side. This graph shows only the impurity concentration of each of the SiC substrate 4, a semiconductor layer 30, the semiconductor layer 11, the buffer layer 2, and the drift layer 3 and does not show the impurity concentrations of other portions where the contact region, the well region, the source region, the drain region, and others are formed.

The silicon carbide stacked substrate according to this modification is different from the silicon carbide stacked substrate described with reference to FIG. 14 in that the semiconductor layer (basal plane dislocation conversion layer, epitaxial layer) 30 having a concentration gradient is provided between the SiC substrate 4 and the semiconductor layer 11 instead of the semiconductor layer 10 having a high concentration shown in FIG. 14. Namely, the structure of the semiconductor chip shown in FIG. 16 is the same as the semiconductor chip described with reference to FIG. 14 except that the semiconductor layer 10 is not provided and the semiconductor layer 30 is provided.

Namely, the lower surface of the semiconductor layer 30 is in contact with the upper surface of the SiC substrate 4, and the upper surface of the semiconductor layer 30 is in contact with the lower surface of the semiconductor layer 11. The semiconductor layer 30 is an epitaxial layer having the concentration gradient in which the concentration of an n type impurity (for example, N (nitrogen) or P (phosphorus)) gradually increases from the side of the lower surface toward the side of the upper surface thereof. For example, the impurity concentration of the lower surface of the semiconductor layer 30 in contact with the SiC substrate 4 is equal to that of the SiC substrate 4. Namely, the impurity concentration of the lower surface of the semiconductor layer 30 is, for example, $5 \times 10^{17}$ cm$^{-3}$ or lower. Meanwhile, the impurity concentration of the upper surface of the semiconductor layer 11 is, for example, $1 \times 10^{17}$ cm$^{-3}$ or higher. As described above, in the semiconductor layer 30, the concentration becomes higher from the lower surface toward the upper surface of the semiconductor layer 30 in the film thickness direction (direction perpendicular to the main surface of the SiC substrate 4) of the semiconductor layer 30.

In the manufacturing method of the silicon carbide stacked substrate according to this modification, the step of forming the semiconductor layer 10 in the manufacturing process of the silicon carbide stacked substrate described with reference to FIG. 14 is not performed, and the semiconductor layer 30 is sequentially formed instead of it.

When forming the semiconductor layer 30 on the SiC substrate 4, the epitaxial growth method is used. By gradually increasing the ratio of nitrogen gas which is impurity dopant gas during the film formation, the semiconductor layer 30 in which the impurity concentration is higher on the upper surface side than the lower surface side can be formed.

Thereafter, as with the process described with reference to FIG. 14, the semiconductor layer 11, the buffer layer 2, and the drift layer 3 are sequentially formed, so that the silicon carbide stacked substrate according to this modification is completed. Subsequently, by performing the same process as that described with reference to FIGS. 6 to 13, the semiconductor chip using the silicon carbide stacked substrate according to this modification can be formed.

In the silicon carbide stacked substrate according to this modification, the impurity concentration of the upper surface of the semiconductor layer 30 is relatively high, for example, $1\times10^{17}$ cm$^{-3}$ or higher, and the concentration of the semiconductor layer 11 in contact with the upper surface is higher than $1\times10^{16}$ cm$^{-3}$ and $1\times10^{17}$ cm$^{-3}$ or lower. However, the impurity concentration of the upper surface of the semiconductor layer 30 is always higher than that of the semiconductor layer 11. Accordingly, the concentration difference between the semiconductor layer 30 and the semiconductor layer 11 at the interface between the semiconductor layer 30 and the semiconductor layer 11 is the same as that between the semiconductor layer 10 and the semiconductor layer 11 described with reference to FIG. 14. Therefore, in this modification, it is possible to obtain the same effect as the silicon carbide stacked substrate described with reference to FIG. 14.

In the foregoing, the invention made by the inventors of the present invention has been concretely described based on the embodiments. However, the present invention is not limited to the foregoing embodiments and various modifications can be made within the scope of the present invention.

For example, the n type silicon carbide stacked substrate has been described in the first and second embodiments, but the same effect described in the first and second embodiments can be obtained even when the conductivity type (first conductivity type) of the silicon carbide stacked substrate is the p type. In this case, the conductivity type of the impurities introduced into the various substrates, semiconductor layers, semiconductor regions, and others is made different from that described above. Specifically, the conductivity type (first conductivity type) of the substrates, layers, and regions described as having the n type in the respective embodiments is changed to the p type, and the conductivity type (second conductivity type) of the regions (for example, well region 80 and first contact region 82 shown in FIG. 2) described as having the p type is changed to the n type. As a p type impurity in this case, for example, B (boron) or Al (aluminum) can be used.

INDUSTRIAL APPLICABILITY

The present invention can be widely used for a silicon carbide stacked substrate and a manufacturing method thereof.

REFERENCE SIGNS LIST 1, 4: SiC substrate
2: buffer layer (depletion barrier layer, epitaxial layer)
3: drift layer (epitaxial layer)
10, 11, 20, 21, 30: semiconductor layer (basal plane dislocation conversion layer, epitaxial layer)

The invention claimed is:

1. A silicon carbide stacked substrate comprising:
a first substrate of a first conductivity type which is a hexagonal semiconductor substrate containing silicon carbide;
a first semiconductor layer of the first conductivity type formed on the first substrate and containing silicon carbide;
a second semiconductor layer of the first conductivity type formed on the first semiconductor layer and containing silicon carbide; and
a third semiconductor layer of the first conductivity type formed on the second semiconductor layer and containing silicon carbide,
wherein the first semiconductor layer is in contact with an upper surface of the first substrate,
wherein a first impurity concentration of the first semiconductor layer is lower than any of a second impurity concentration of the second semiconductor layer and a fourth impurity concentration of the upper surface of the first substrate and is higher than a third impurity concentration of the third semiconductor layer, and the second impurity concentration is higher than the third impurity concentration,
wherein the first impurity concentration is $1\times10^{17}$ cm$^{-3}$ or lower, and
wherein the fourth impurity concentration is higher than $1\times10^{18}$ cm$^{-3}$.

2. The silicon carbide stacked substrate according to claim 1,
wherein the first impurity concentration is higher than $1\times10^{16}$ cm$^{-3}$ and $1\times10^{17}$ cm$^{-3}$ or lower.

3. The silicon carbide stacked substrate according to claim 2,
wherein the fourth impurity concentration and the second impurity concentration are $1\times10^{17}$ cm$^{-3}$ or higher.

4. The silicon carbide stacked substrate according to claim 1,
wherein the fourth impurity concentration is higher than the second impurity concentration.

5. The silicon carbide stacked substrate according to claim 1,
wherein the first semiconductor layer, the second semiconductor layer, and the third semiconductor layer are epitaxial layers.

6. A silicon carbide stacked substrate comprising:
a second substrate of a first conductivity type which is a hexagonal semiconductor substrate containing silicon carbide;
a fifth semiconductor layer of the first conductivity type formed on the second substrate and containing silicon carbide;
a first semiconductor layer of the first conductivity type formed on the fifth semiconductor layer and containing silicon carbide;
a second semiconductor layer of the first conductivity type formed on the first semiconductor layer and containing silicon carbide; and
a third semiconductor layer of the first conductivity type formed on the second semiconductor layer and containing silicon carbide,
wherein the first semiconductor layer is in contact with an upper surface of the fifth semiconductor layer,
wherein a first impurity concentration of the first semiconductor layer is lower than any of a second impurity concentration of the second semiconductor layer and a fifth impurity concentration of the upper surface of the fifth semiconductor layer and is higher than a third impurity concentration of the third semiconductor layer, the second impurity concentration is higher than the third impurity concentration, and a sixth impurity concentration of the second substrate is lower than the second impurity concentration, wherein an upper surface of the third semiconductor layer constitutes an outermost surface of the silicon carbide stacked substrate, wherein the fifth impurity concentration is $1\times10^{17}$ cm$^{-3}$ or higher, wherein the sixth impurity concentration is lower than $1\times10^{17}$ cm$^{-3}$, and wherein of the plurality of layers provided between the second substrate and the third semiconductor layer, only the first semiconductor layer has an impurity concentration of $1\times10^{17}$ cm$^{-3}$ or lower.

7. The silicon carbide stacked substrate according to claim 6, wherein the first impurity concentration is higher than $1\times10^{16}$ cm$^{-3}$ and $1\times10^{17}$ cm$^{-3}$ or lower.

8. The silicon carbide stacked substrate according to claim 7, wherein the fifth impurity concentration and the second impurity concentration are $1\times10^{17}$ cm$^{-3}$ or higher.

9. The silicon carbide stacked substrate according to claim 6, wherein the fifth semiconductor layer, the first semiconductor layer, the second semiconductor layer, and the third semiconductor layer are epitaxial layers.

10. The silicon carbide stacked substrate according to claim 6, further comprising:

a seventh semiconductor layer of the first conductivity type formed on the first semiconductor layer and containing silicon carbide; and an eighth semiconductor layer of the first conductivity type formed on the seventh semiconductor layer and containing silicon carbide, wherein the second semiconductor layer is formed on the eighth semiconductor layer, the eighth semiconductor layer is in contact with an upper surface of the seventh semiconductor layer, and an eighth impurity concentration of the eighth semiconductor layer is lower than any of the second impurity concentration and a seventh impurity concentration of the upper surface of the seventh semiconductor layer and is higher than the third impurity concentration.

11. The silicon carbide stacked substrate according to claim 6, wherein a lower surface of the fifth semiconductor layer has a ninth impurity concentration lower than the fifth impurity concentration, and the fifth semiconductor layer has a concentration gradient in which an impurity concentration gradually increases from the lower surface of the fifth semiconductor layer toward the upper surface of the fifth semiconductor layer.

12. The silicon carbide stacked substrate according to claim 1, wherein a relationship of the first, second, third, and fourth impurity concentrations of said first, second, third, and fourth semiconductor layers, respectively, is the fourth impurity concentration>the second impurity concentration>the first impurity concentration>the third impurity concentration.

13. The silicon carbide stacked substrate according to claim 1, wherein a film thickness of the second semiconductor layer is 0.5 to 8 μm.

* * * * *